US012633916B2

(12) United States Patent
Habu et al.

(10) Patent No.: US 12,633,916 B2
(45) Date of Patent: May 19, 2026

(54) GATE DRIVING DEVICE

(71) Applicant: Mitsubishi Electric Corporation, Tokyo (JP)

(72) Inventors: Yo Habu, Tokyo (JP); Takashi Watanabe, Fukuoka (JP); Shohei Higashi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 68 days.

(21) Appl. No.: 18/900,081

(22) Filed: Sep. 27, 2024

(65) Prior Publication Data

US 2025/0192775 A1 Jun. 12, 2025

(30) Foreign Application Priority Data

Dec. 8, 2023 (JP) ................................. 2023-207475

(51) Int. Cl.
*H02M 1/08* (2006.01)
*H03K 17/687* (2006.01)

(52) U.S. Cl.
CPC .......... *H03K 17/6872* (2013.01); *H02M 1/08* (2013.01)

(58) Field of Classification Search
CPC .... H02M 1/08; H03K 17/687; H03K 17/6872
USPC ................................................. 327/108, 109
See application file for complete search history.

(56) References Cited

U.S. PATENT DOCUMENTS

| | | | | |
|---|---|---|---|---|
| 11,139,753 B2 * | 10/2021 | Ikeda | ...................... | H02M 1/08 |
| 2009/0015224 A1 | 1/2009 | Hirao et al. | | |
| 2013/0222042 A1 | 8/2013 | Kikuchi et al. | | |

FOREIGN PATENT DOCUMENTS

| | | |
|---|---|---|
| JP | 2009-022106 A | 1/2009 |
| JP | 2009-200891 A | 9/2009 |
| JP | 2013-179390 A | 9/2013 |

* cited by examiner

*Primary Examiner* — William Hernandez
(74) *Attorney, Agent, or Firm* — Studebaker Brackett PLLC

(57) ABSTRACT

A gate driving device according to the present disclosure includes a gate driver circuit, a first capacitor provided outside, and a first diode. The gate driver circuit includes first and second transistors that operate complementarily, are connected in series between a first node at a first voltage and a second node at a second voltage lower than the first voltage, and have a connection node serving as an output node of the gate driving device; a first charge transistor and a first negative-bias transistor that are connected in series between the first node and a third node at a third voltage lower than the first voltage and higher than the second voltage and have a connection node connected to one electrode of the first capacitor; and a logic circuit that controls each transistor.

12 Claims, 19 Drawing Sheets

F I G. 1

100

F I G. 2
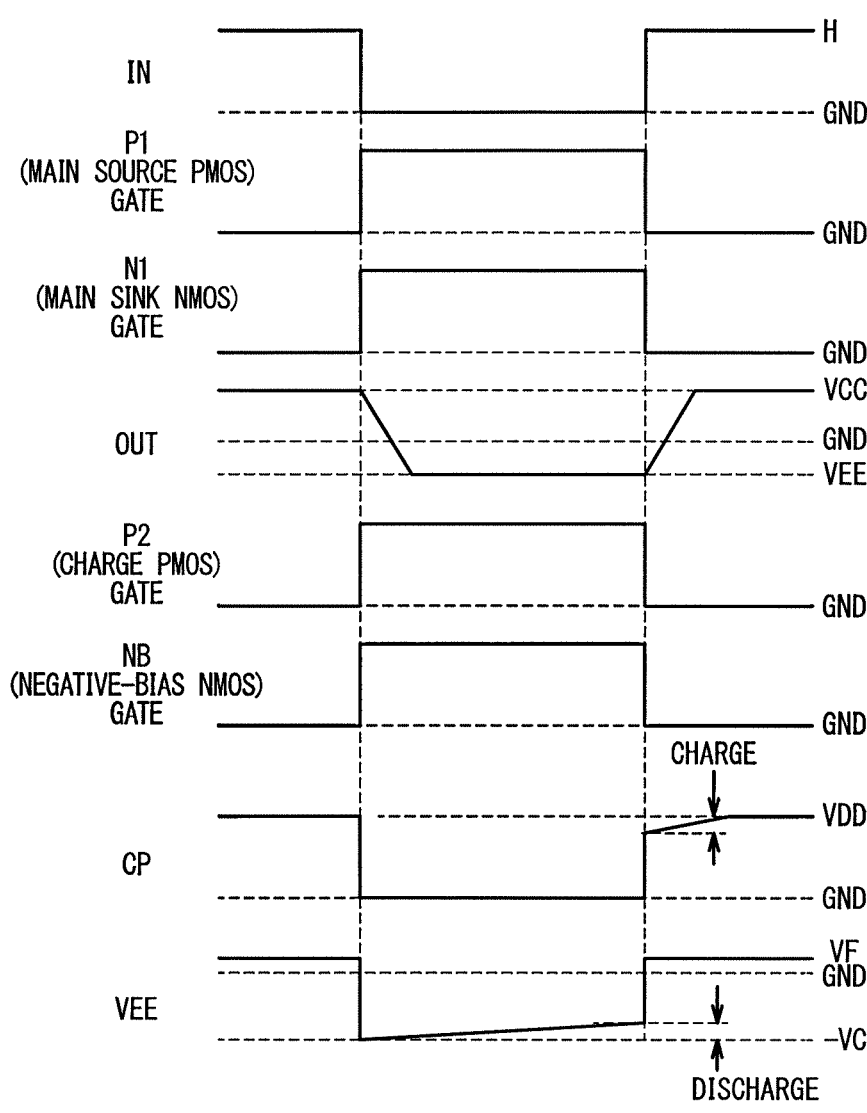

F I G. 3
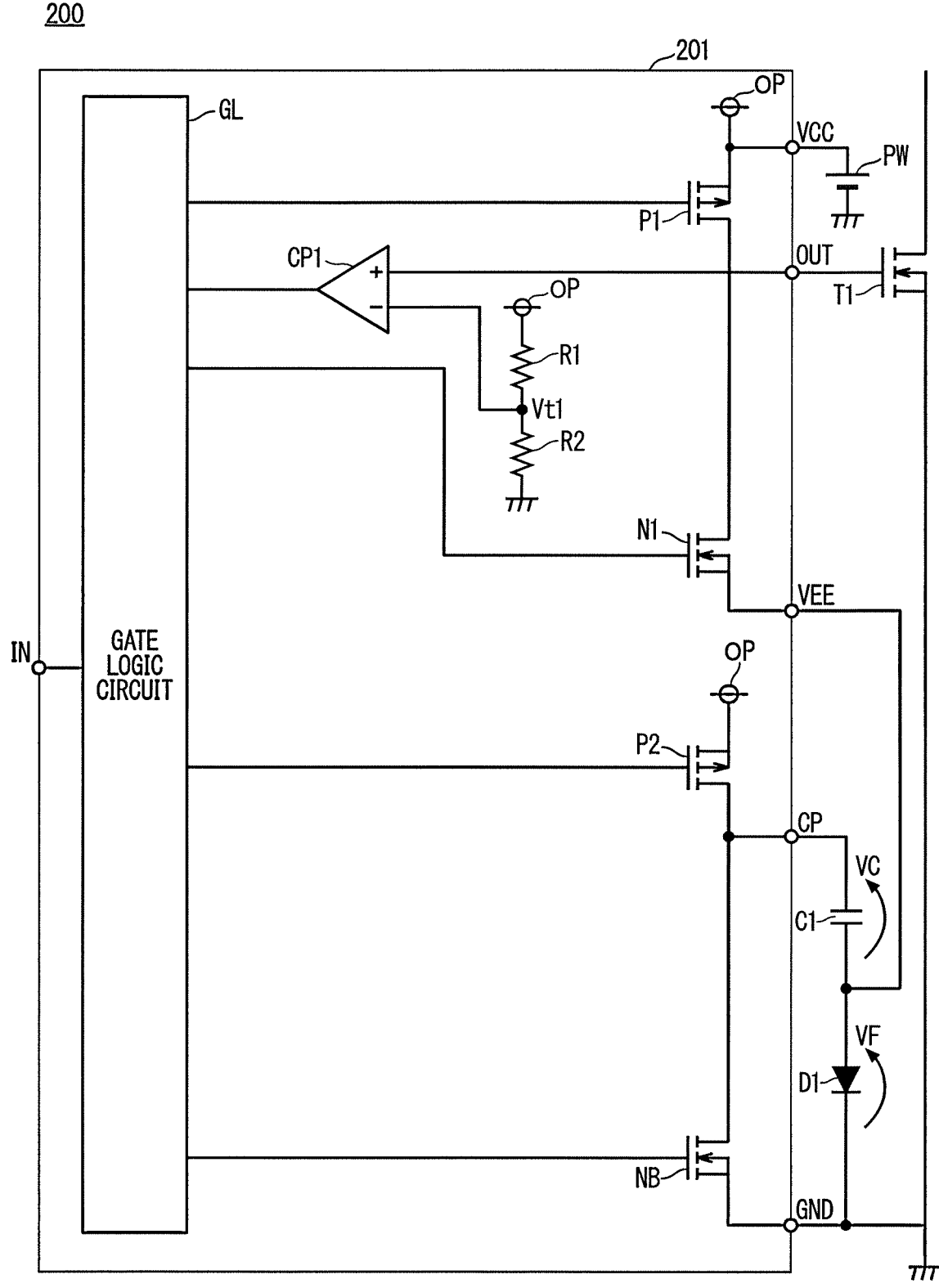

F I G. 5
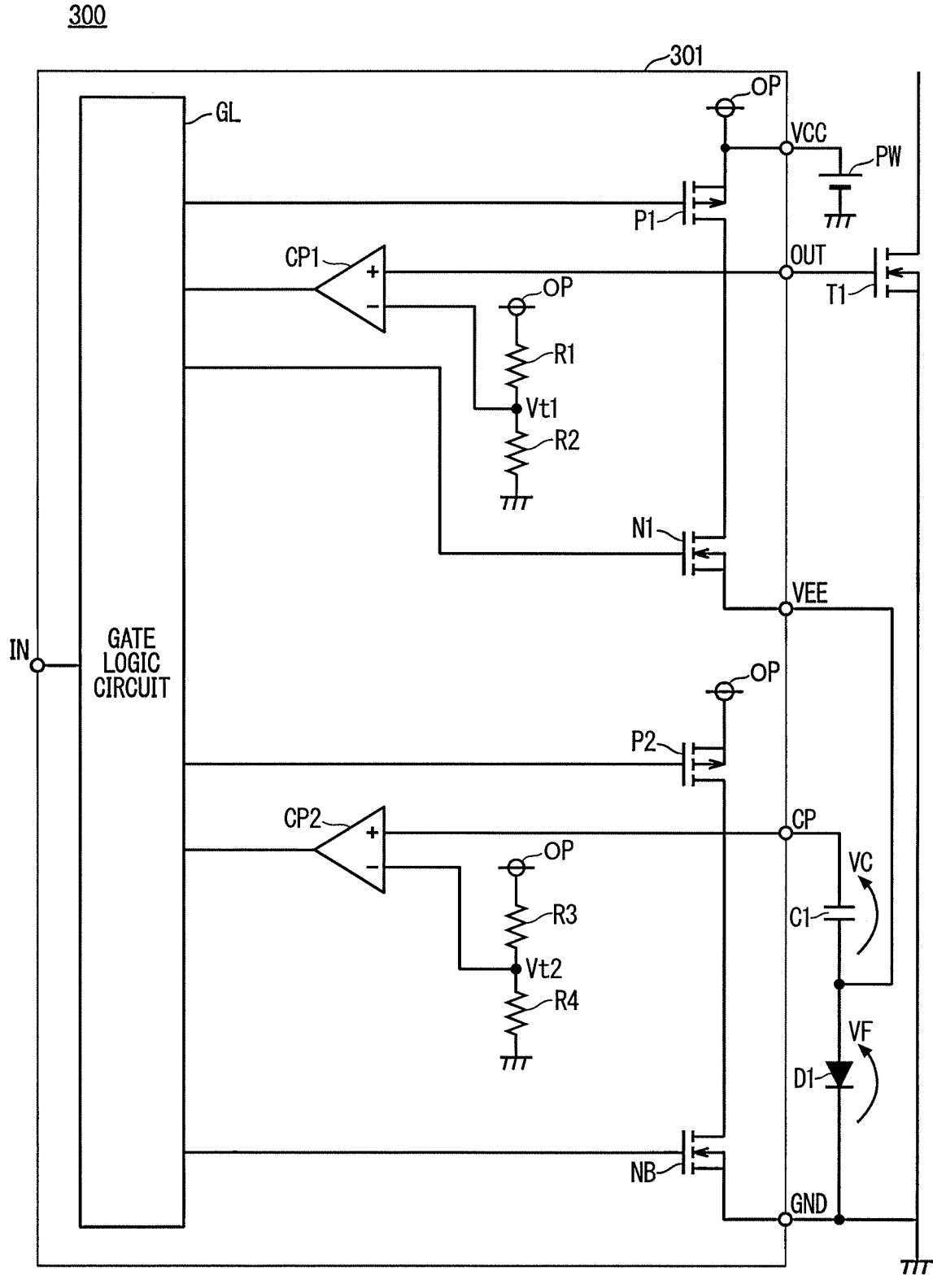

F I G. 6
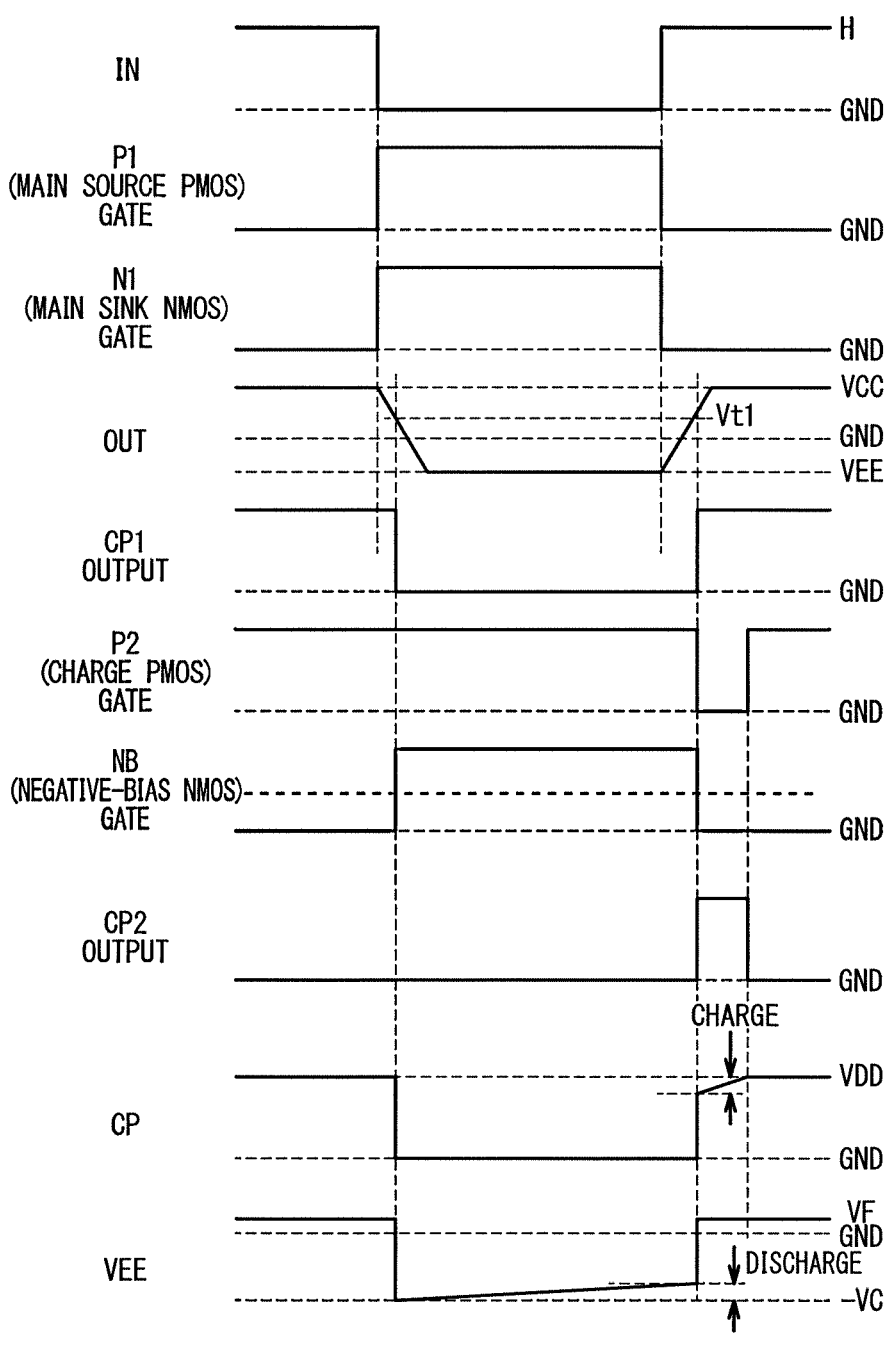

F I G. 9
500
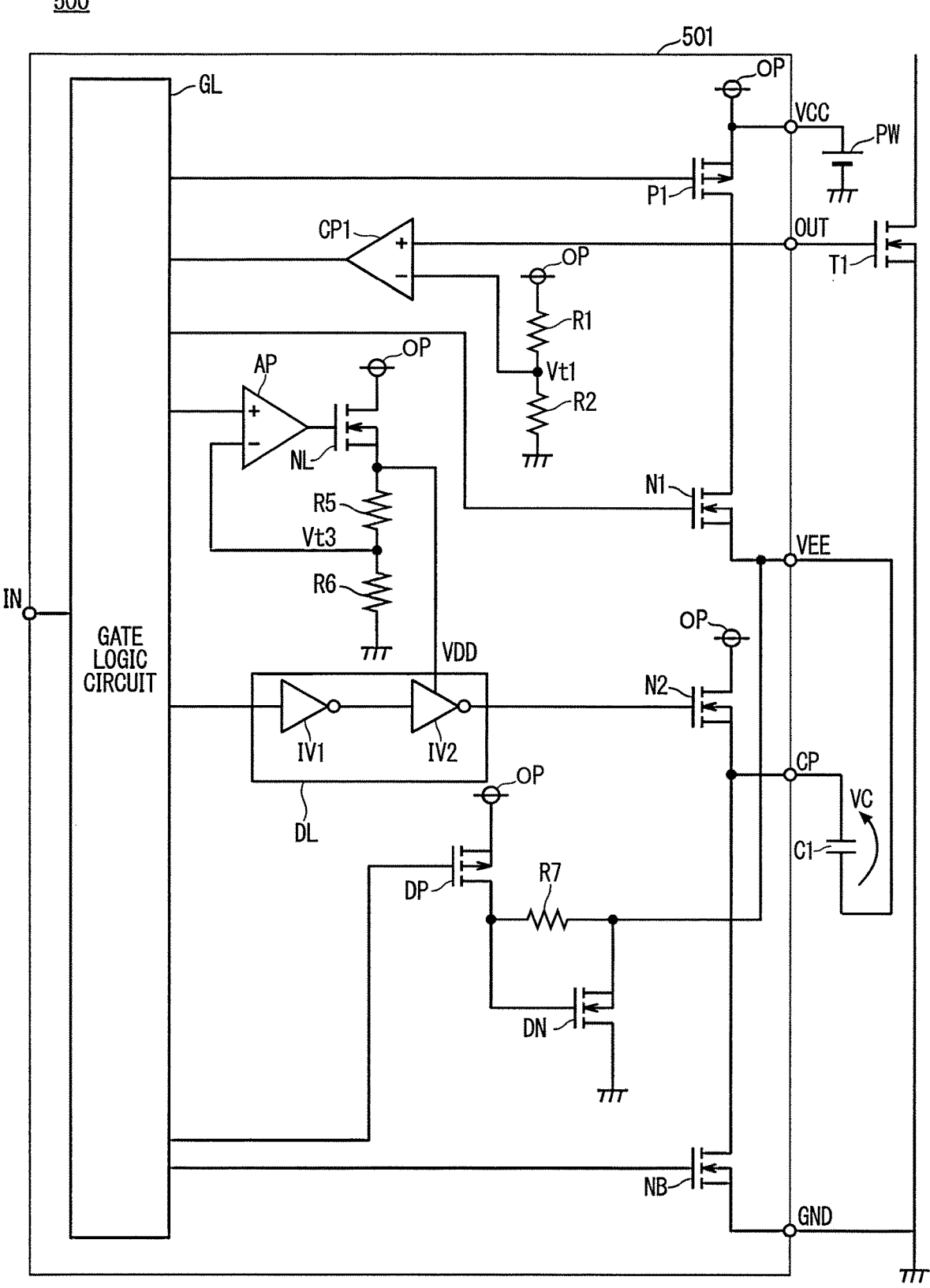

F I G. 10
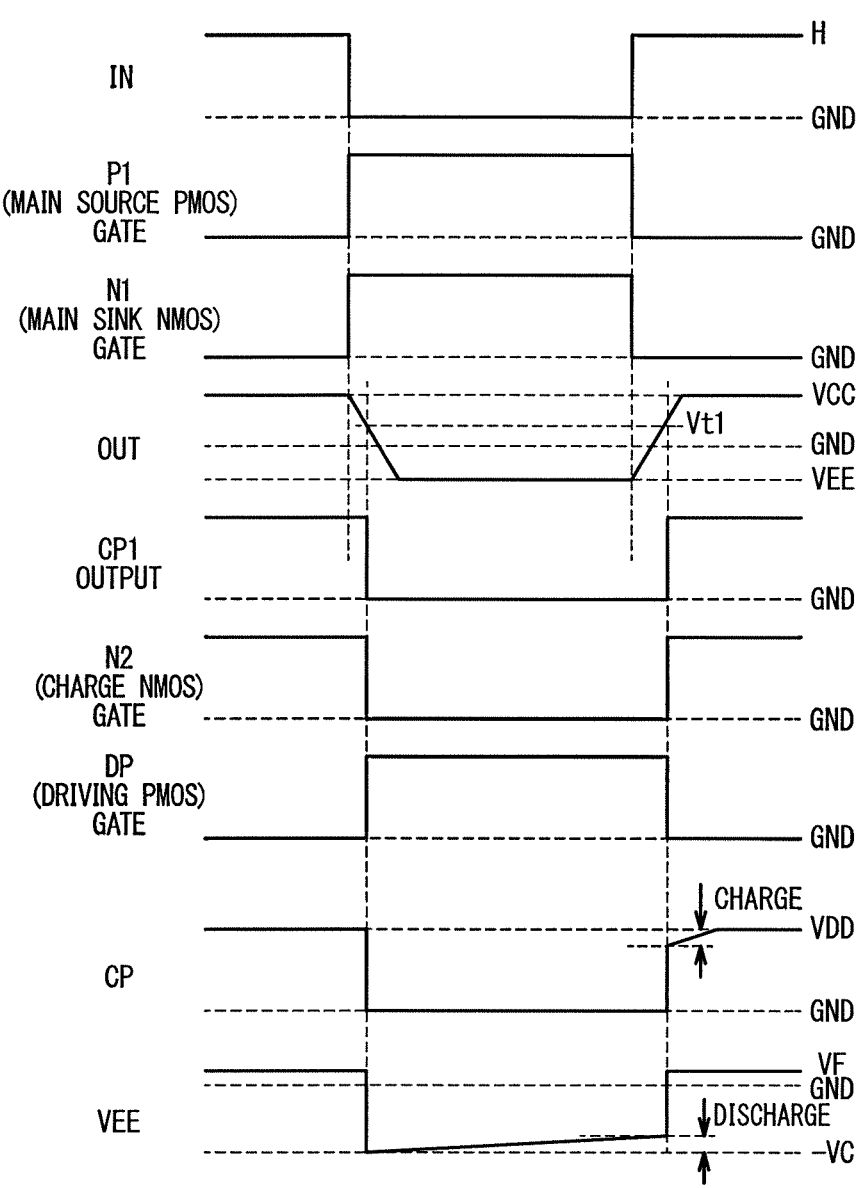

F I G. 11
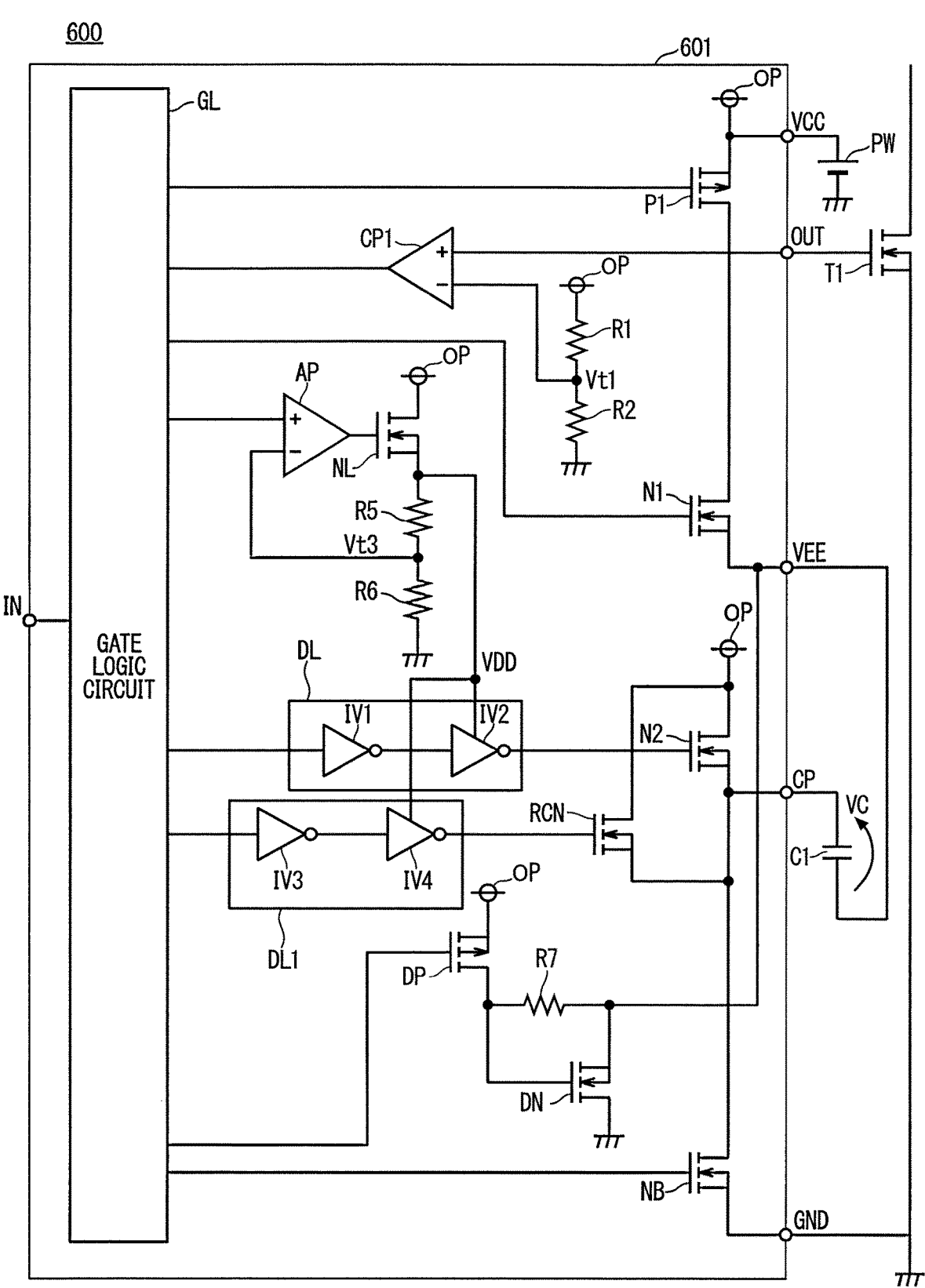

F I G. 12
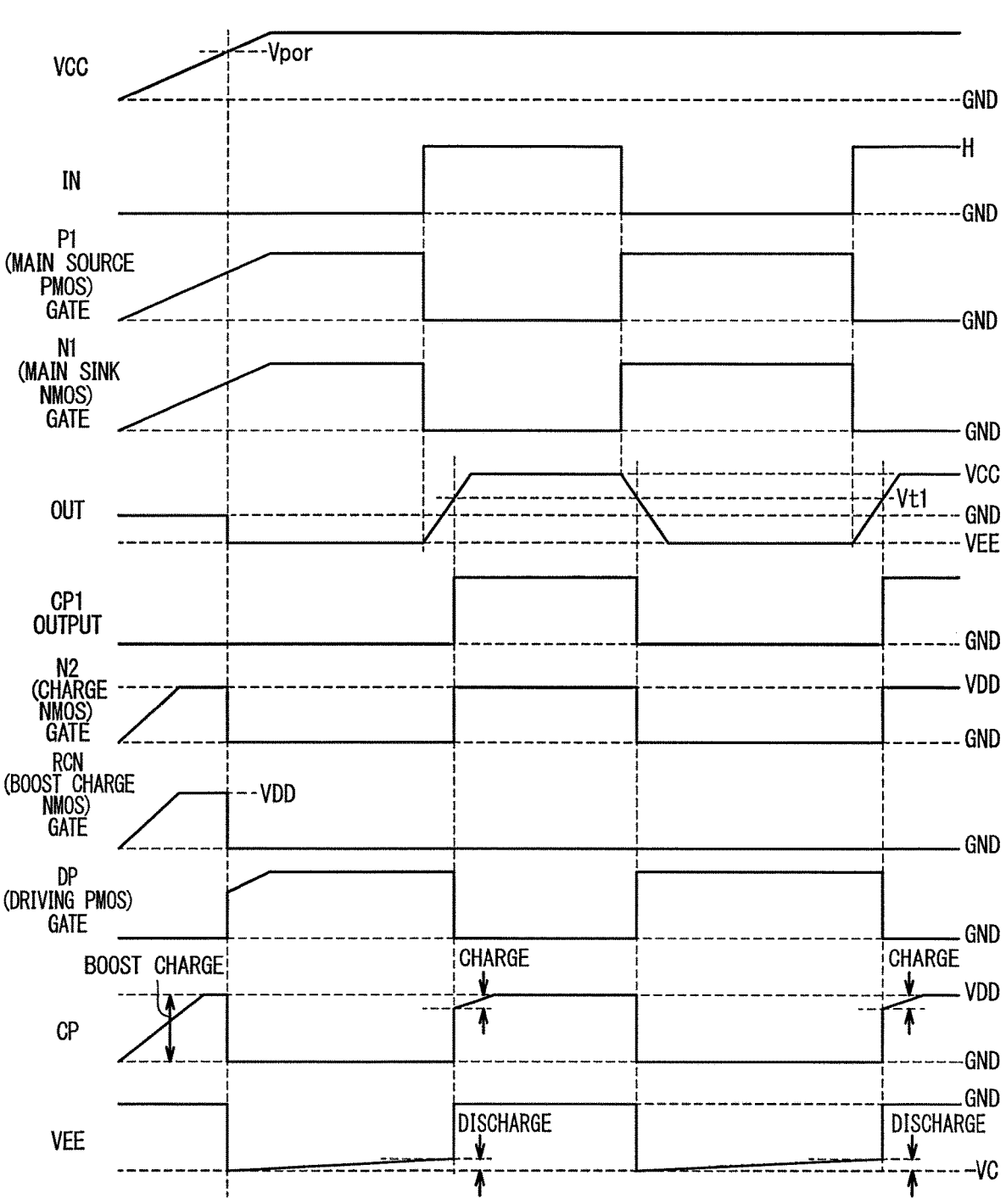

F I G. 16
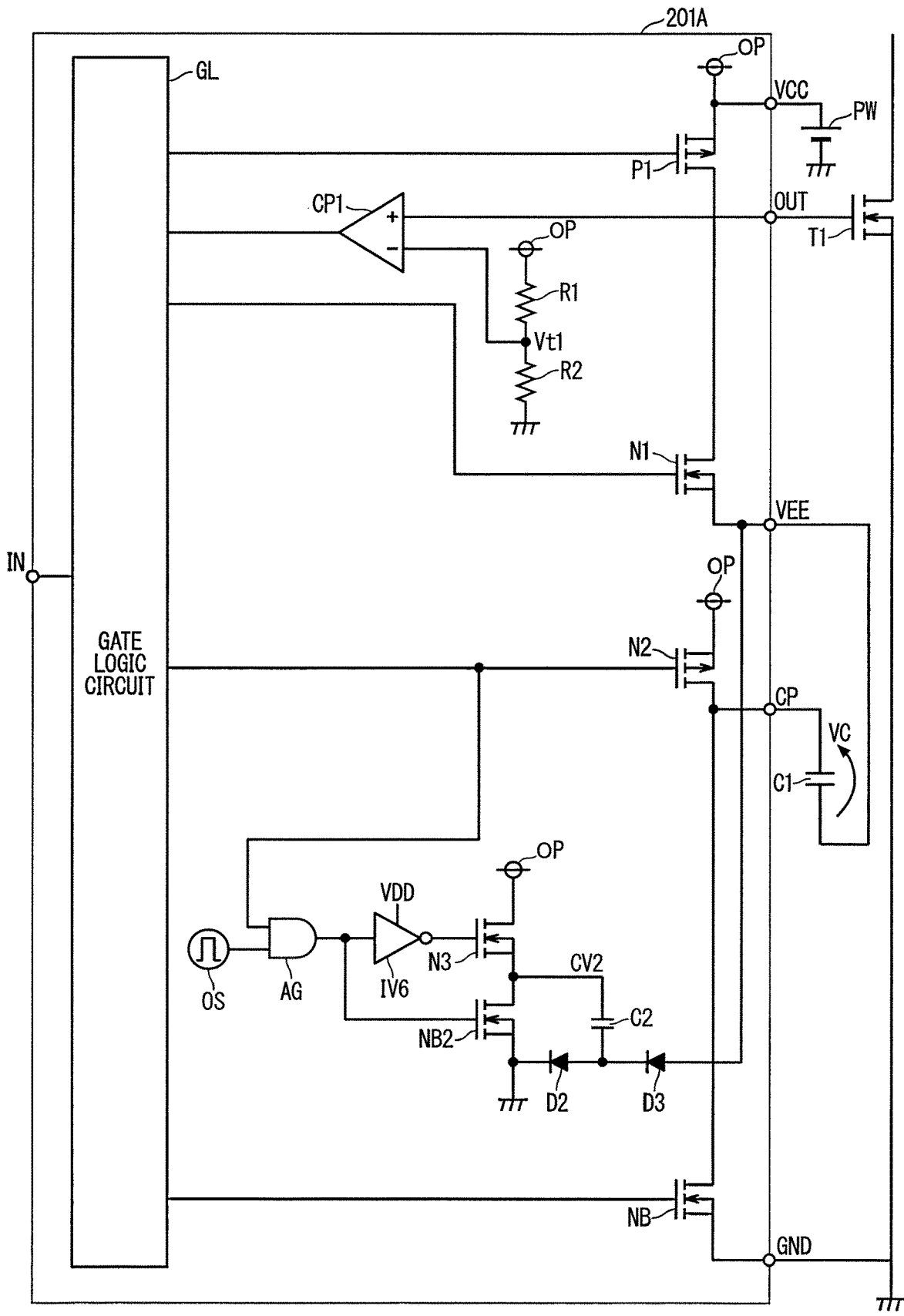

F I G. 17
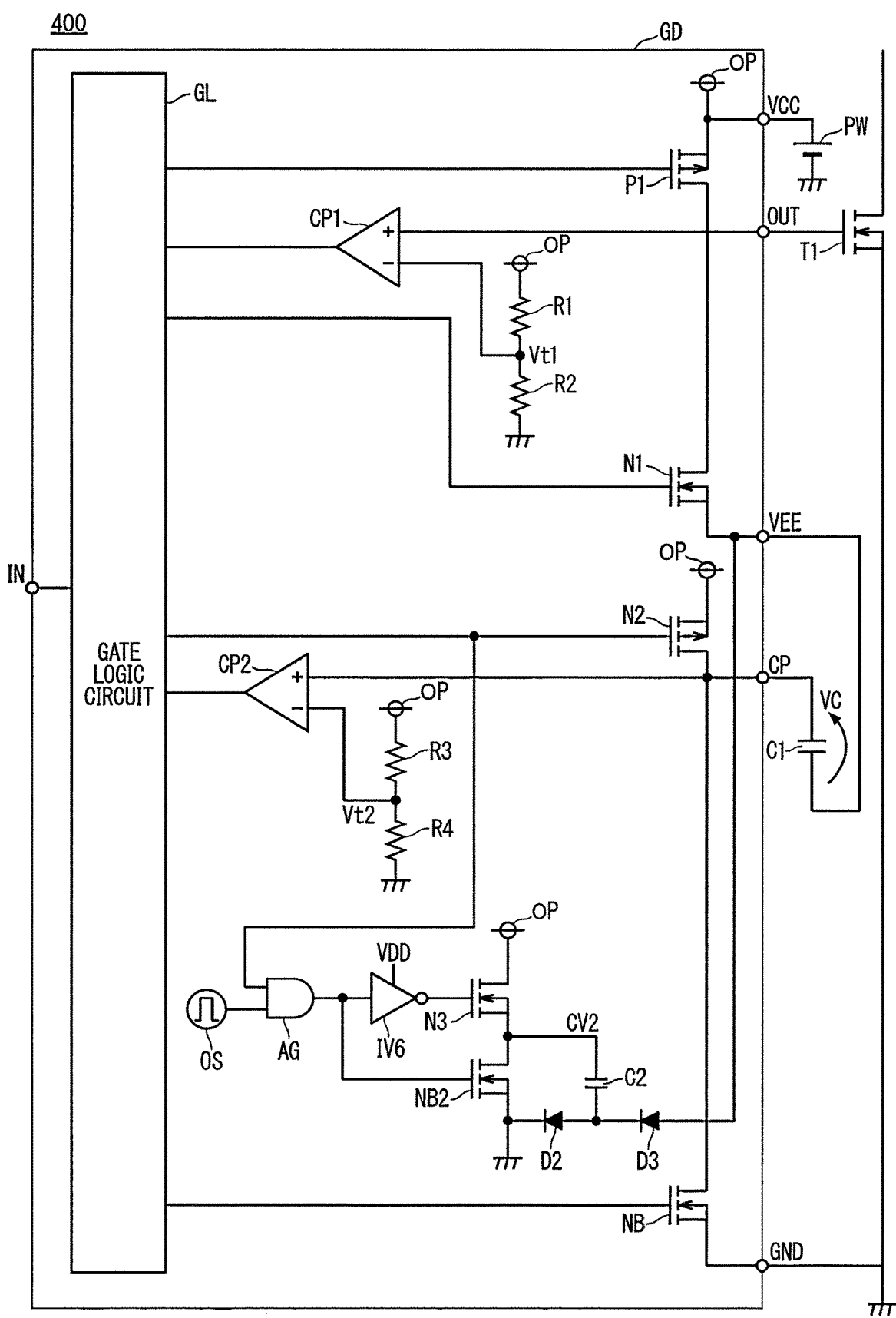

F I G. 18
400
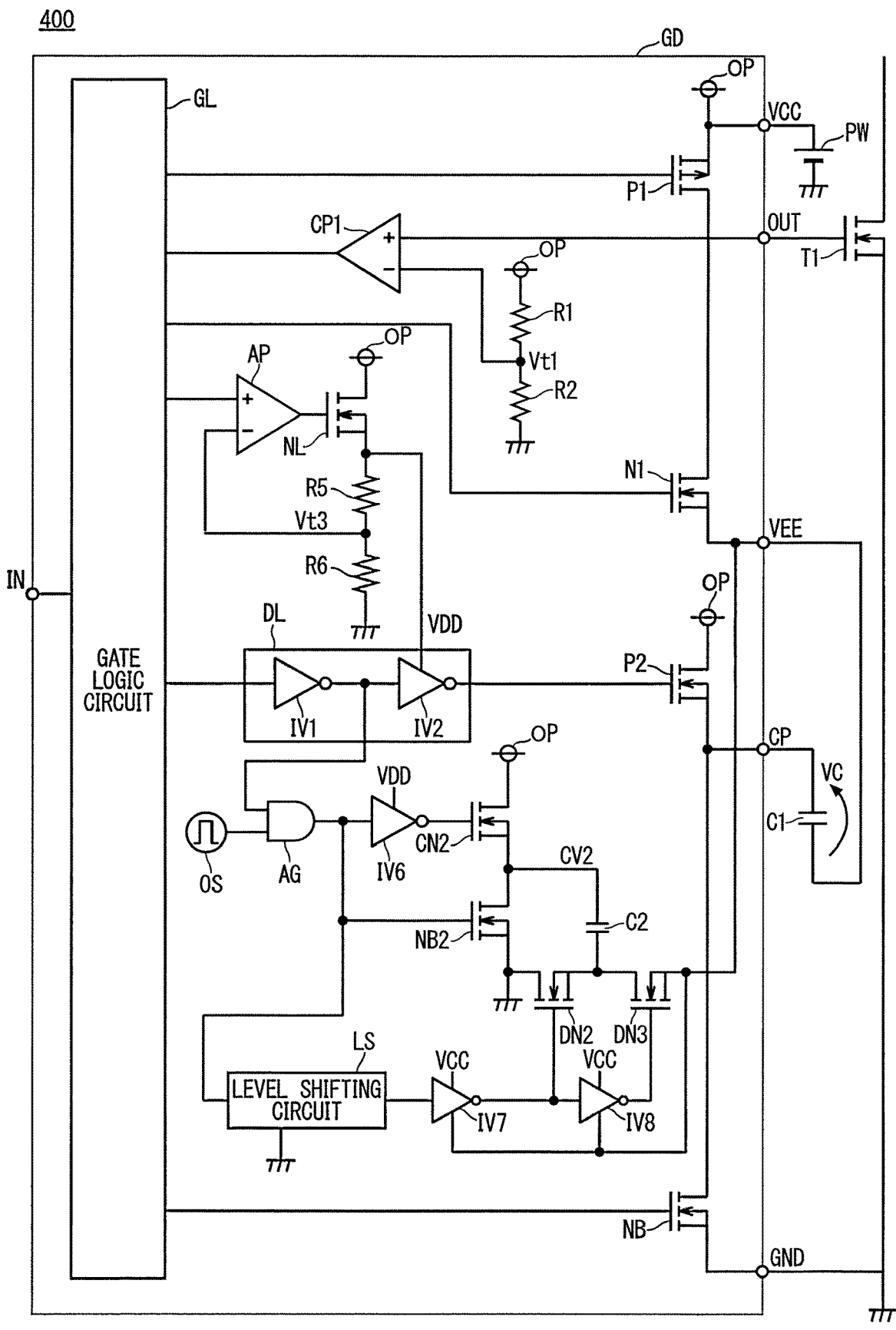

F I G. 19
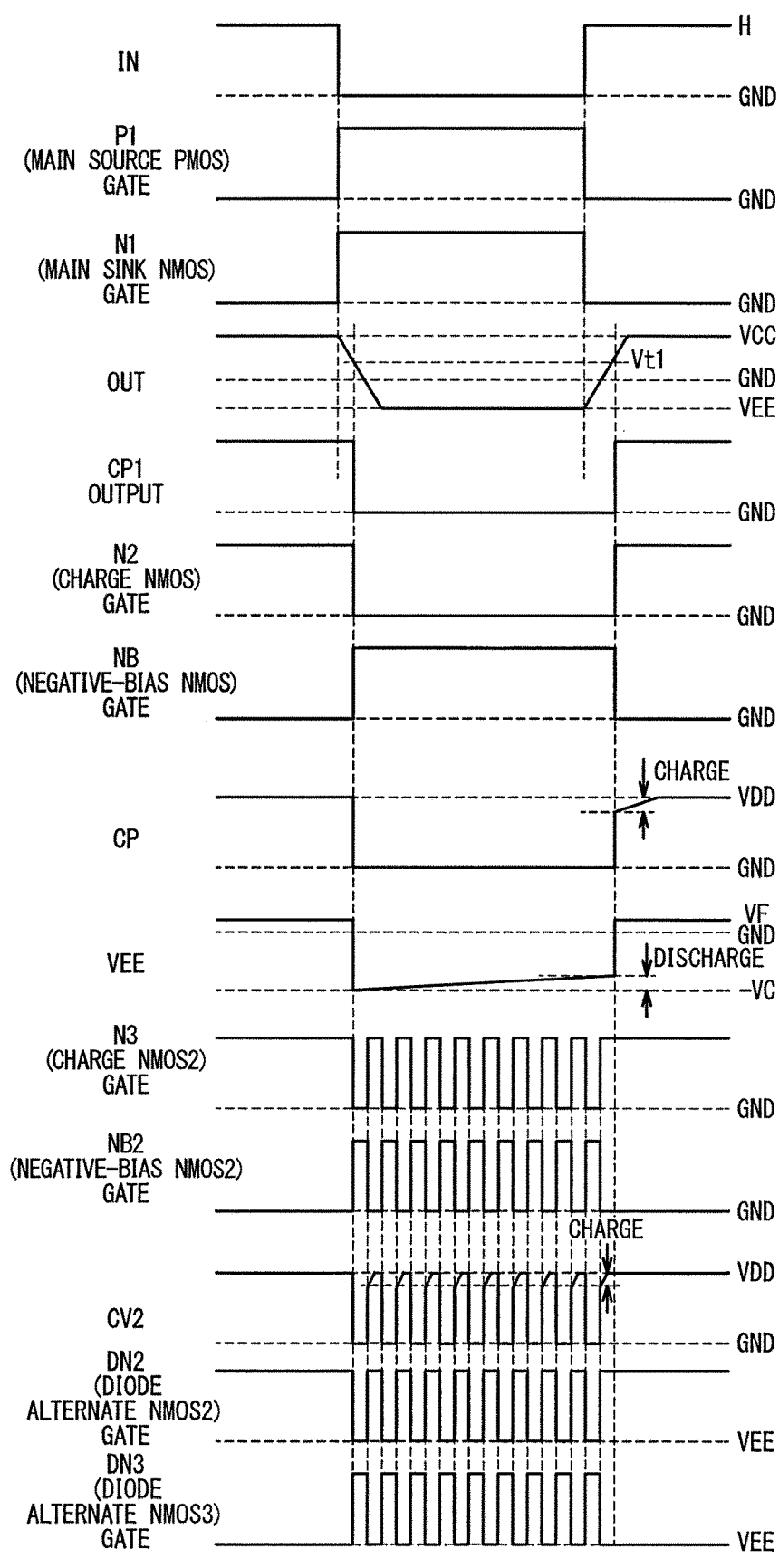

GATE DRIVING DEVICE

BACKGROUND OF THE INVENTION

Field of the Invention

The present disclosure relates to a gate driving device for driving a semiconductor switching device.

Description of the Background Art

One example of conventional gate driving devices is a gate driving circuit disclosed in Japanese Patent Application Laid-Open No. 2009-200891 (Patent Literature (PTL) 1). PTL 1 discloses, in FIG. 1, a configuration of the gate driving circuit for generating positive and negative voltage pulses by using the source or emitter of a main switching element as a reference potential. The gate driving circuit includes a capacitor, a controlled power supply that is connected to the source or emitter of the main switching element, and charging means for charging the capacitor from the controlled power supply, in which electric charge stored in the capacitor is used to charge or discharge the gate capacitance of the main switching element.

In the gate driving circuit disclosed in PTL 1, the capacitor is charged during the turn-on period of the main switching element, and when the main switching element is turned off, a negative bias is applied from the capacitor to the gate of the main switching element. This allows high-speed turn-off behavior without using a negative-bias power supply and reduces switching losses.

There is a problem with the technique disclosed in PTL 1 in that the gate driving circuit includes a diode that serves as switching means configuring the capacitor and the charging means which are necessary for the application of a negative bias, so that it is difficult to adjust the constants of the capacitor and diodes in accordance with the main switching element.

SUMMARY

It is an object of the present disclosure to provide a gate driving device capable of adjusting the constants of circuit elements in accordance with a transistor to be driven.

A gate driving device according to the present disclosure is a gate driving device for driving a gate of a transistor. The gate driving device includes a gate driver circuit that includes a first transistor of a first conductivity type, a second transistor of a second conductivity type, a first charge transistor, a first negative-bias transistor, and a logic circuit, a first capacitor provided outside, and a first diode. The first transistor and the second transistor operate complementarily, are connected in series between a first node and a second node, and have a connection node serving as an output node of the gate driving device, the first node being a node to which a first voltage is applied, the second node being a node to which a second voltage lower than the first voltage is applied. The first charge transistor and the first negative-bias transistor are connected in series between the first node and a third node and have a connection node connected to a capacitance node, the third node being a node to which a third voltage lower than the first voltage and higher than the second voltage is applied, the capacitance node being connected to one electrode of the first capacitor. The logic circuit controls the first transistor, the second transistor, the first charge transistor, and the first negative-bias transistor. The first diode has an anode connected to the second node and to the other electrode of the first capacitor and has a cathode connected to the third node.

The gate driving device according to the present disclosure is capable of adjusting the constants of circuit elements in accordance with the transistor to be driven and is also capable of adjusting the negative bias applied to the transistor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a configuration of a gate driving device according to Embodiment 1 of the present disclosure.

FIG. 2 is a control sequence diagram for the gate driving device according to Embodiment 1 of the present disclosure.

FIG. 3 is a circuit diagram showing a configuration of a gate driving device according to Embodiment 2 of the present disclosure.

FIG. 5 is a circuit diagram showing a configuration of a gate driving device according to Embodiment 3 of the present disclosure.

FIG. 6 is a control sequence diagram for the gate driving device according to Embodiment 3 of the present disclosure.

FIG. 9 is a circuit diagram showing a configuration of a gate driving device according to Embodiment 5 of the present disclosure.

FIG. 10 is a control sequence diagram for the gate driving device according to Embodiment 5 of the present disclosure.

FIG. 11 is a circuit diagram showing a configuration of a gate driving device according to Embodiment 6 of the present disclosure.

FIG. 12 is a control sequence diagram for the gate driving device according to Embodiment 6 of the present disclosure.

FIG. 16 is a circuit diagram showing another configuration according to Variation 1 of Embodiment 7 of the present disclosure.

FIG. 17 is a circuit diagram showing another configuration according to Variation 1 of Embodiment 7 of the present disclosure.

FIG. 18 is a circuit diagram showing a configuration according to Variation 2 of Embodiment 7 of the present disclosure.

FIG. 19 is a control sequence diagram according to Variation 2 of Embodiment 7 of the present disclosure.

DESCRIPTION OF THE PREFERRED EMBODIMENTS

Embodiment 1

Figure 1:
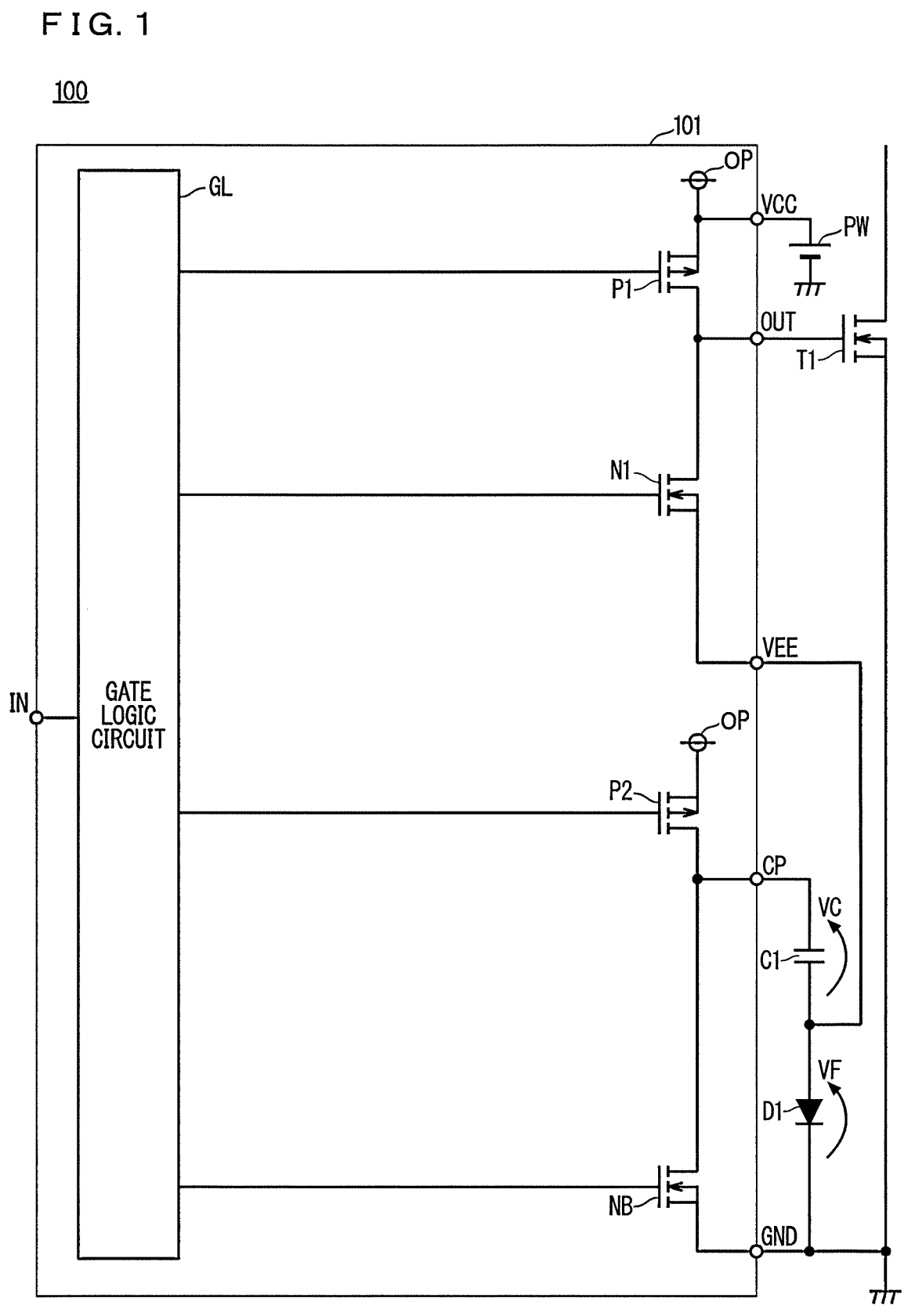
Figure 4:
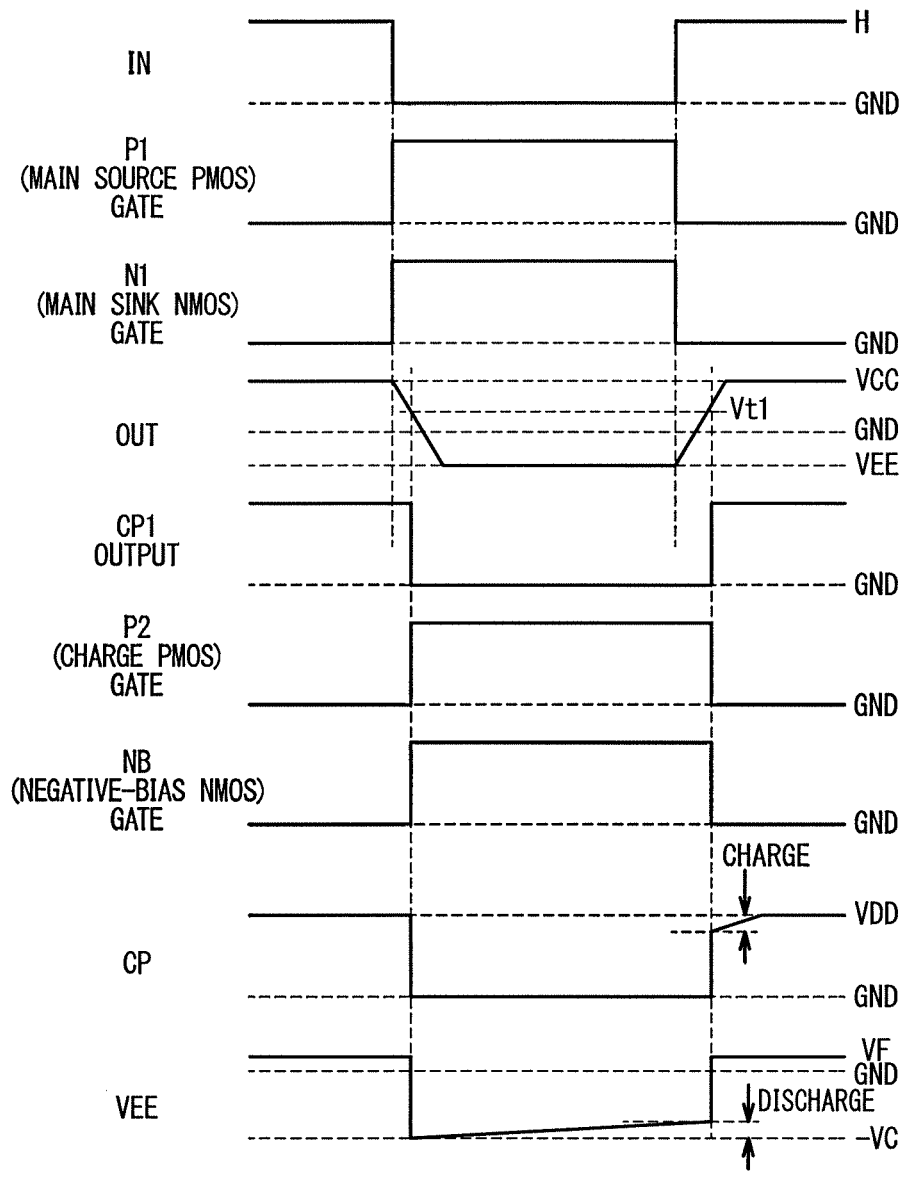
FIG. 4 is a control sequence diagram for the gate driving device according to Embodiment 2 of the present disclosure.

FIG. 1 is a circuit diagram showing a configuration of a gate driving device 100 according to Embodiment 1 of the present disclosure. As shown in FIG. 1, the gate driving device 100 drives a high voltage-proof MOS transistor T1 of an N channel type (hereinafter, referred to as "N type") serving as a power device. The gate driving device 100 includes a gate driver IC 101, a diode D1, and a capacitor C1, the gate driver IC 101 being configured as an integrated circuit (IC), the diode D1 and the capacitor C1 being provided outside the gate driver IC 101 to adjust the turn-off speed of the power device.

The gate driver IC 101 has a VCC terminal (first node) to which a VCC voltage (first voltage) is supplied from a DC power supply PW, an OUT terminal (output node) from which an output signal is supplied to the MOS transistor T1, a VEE terminal (second terminal) to which a VEE voltage (second voltage) is supplied, a CP terminal (capacitance node) connected to the capacitor C1, a GND terminal (third node) the voltage at which serves as a GND voltage (third voltage), and an IN terminal to which an input signal is supplied.

The gate driver IC 101 includes a gate logic circuit GL, a main source MOS transistor P1 of a P channel type (hereinafter, referred to as "P type") (this transistor is hereinafter also referred to as the "main source PMOS"), and a main sink MOS transistor N1 of the N type (hereinafter, also referred to as the "main sink NMOS"), the main source PMOS and the main sink NMOS being connected in series between the VCC terminal and the VEE terminal (second node).

The gate driver IC 101 further includes a charge MOS transistor P2 of the P type (hereinafter, also referred to as the "charge PMOS") and a negative-bias MOS transistor NB of the N type (hereinafter, also referred to as the "negative-bias NMOS") that are connected in series between the GND terminal and an internal terminal OP to which the VCC voltage is supplied.

The gate logic circuit GL inputs a logic signal to the gates of the MOS transistor P1, the MOS transistor N1, the MOS transistor P2, and the MOS transistor NB.

The source of the MOS transistor P1 is connected to the VCC terminal, the drains of the MOS transistor P1 and the MOS transistor N1 are connected to the OUT terminal, and the source of the MOS transistor N1 is connected to the VEE terminal.

The drains of the MOS transistor P2 and the MOS transistor NB are connected to the CP terminal, and the source of the MOS transistor NB is connected to the GND terminal.

The cathode of the diode D1 is connected to the GND terminal, the anode of the diode D1 is connected to one electrode of the capacitor C1 and to the VEE terminal, and the other electrode of the capacitor C1 is connected to the CP terminal.

Upon receiving input of a signal with a potential High (H-signal) to the IN terminal, the gate logic circuit GL performs first output switching control in which a signal with a potential LOW (L-signal) is input to the gates of the MOS transistor P1 and the MOS transistor N1 to turn on the MOS transistor P1 and turn off the MOS transistor N1 so that the output from the OUT terminal is switched from the L-signal to the H-signal.

Simultaneously with this, the gate logic circuit GL also performs charging control in which the L-signal is also input to the gates of the MOS transistor P2 and the MOS transistor NB to turn on the MOS transistor P2 and turn off the MOS transistor NB so that the capacitor C1 connected to the CP terminal is charged.

Upon receiving input of an L-signal to the IN terminal, the gate logic circuit GL performs second output switching control in which an H-signal is input to the gates of the MOS transistor P1 and the MOS transistor N1 to turn off the MOS transistor P1 and turn on the MOS transistor N1 so that the output from the OUT terminal is switched from the H-signal to the L-signal.

Simultaneously with this, the gate logic circuit GL also performs negative-bias application control in which the H-signal is also input to the gates of the MOS transistor P2 and the MOS transistor NB to turn off the MOS transistor P2 and turn on the MOS transistor NB so that a negative bias is applied to the OUT terminal via the VEE terminal.

FIG. 2 is a control sequence diagram for the gate driver IC 101. As shown in FIG. 2, when an H-signal is input to the IN terminal serving as an input terminal in order to turn on the MOS transistor T1, the MOS transistor P1 (main source PMOS) is turned on and the MOS transistor N1 (main sink NMOS) is turned off so that the voltage at the OUT terminal rises to the VCC voltage (high). Simultaneously with the rise in the voltage at the OUT terminal, the MOS transistor P2 (charge PMOS) is turned on and the MOS transistor NB (negative-bias NMOS) is turned off. At this time, a voltage VC at the capacitor C1 connected to the CP terminal is charged up to VCC–VF (V), where VF is the forward voltage of the diode D1.

On the other hand, when an L-signal is input to the IN terminal in order to turn off the MOS transistor T1, the MOS transistor P1 is turned off and the MOS transistor N1 is turned on so that the voltage at the OUT terminal becomes low. Simultaneously with the drop in the voltage at the OUT terminal, the MOS transistor P2 is turned off and the MOS transistor NB is turned on.

At this time, the voltage at the VEE terminal becomes –VC (–VCC+VF (V)) due to the discharge of the capacitor C1, and a negative bias is applied to the gate of the MOS transistor T1. The electric charge discharged from the capacitor C1 will be charged during the next period in which the voltage at the OUT terminal is high.

In this way, in the gate driving device 100, a negative bias is applied to the gate of the MOS transistor T1 to turn off the MOS transistor T1. This allows the electric charge stored in the gate capacitance of the MOS transistor T1 to be drawn at high speed and thereby speed up the turn-off behavior. Besides, since the diode D1 and the capacitor C1 are provided outside the gate driver IC 101 in order to adjust the turn-off speed of the MOS transistor T1. Accordingly, it is possible to flexibly adjust the constants of the diode D1 and the capacitor C1 in compliance with the specifications of the MOS transistor T1.

Although the high voltage-proof MOS transistor is illustrated as the power device in Embodiment 1, the power device may also be an insulated gate bipolar transistor (IGBT) or an SiC-MOS configured by a silicon carbide (SiC) semiconductor. The signal logic of the IN terminal and the OUT terminal may be reversed.

Embodiment 2

FIG. 3 is a circuit diagram showing a configuration of a gate driving device 200 according to Embodiment 2 of the present disclosure. As shown in FIG. 3, the gate driving device 200 drives a high voltage-proof MOS transistor T1 of an n-channel type serving as a power device. The gate driving device 200 includes a gate driver IC 201, a diode D1, and a capacitor C1, the diode D1 and the capacitor C1 being provided outside the gate driver IC 201 to adjust the turn-off speed of the power device.

The gate driver IC 201 further includes partial pressure resistances R1 and R2 and a comparator CP1 in addition to the configuration of the gate driver IC 101 shown in FIG. 1. The partial pressure resistances R1 and R2 are connected in series between an internal terminal OP and a GND, terminal. The comparator CP1 has a non-inverting input terminal (V+) connected to the OUT terminal and an inverting input terminal (V−) connected to a midpoint between the partial pressure resistances R1 and R2 to receive input of a midpoint potential Vt1, and outputs an output voltage to the gate logic circuit GL. In FIG. 3, constituent elements that are identical to those of the gate driver IC 101 are given the same reference signs, and redundant descriptions thereof shall be omitted.

Upon receiving an input of an H-signal to the IN terminal, the gate logic circuit GL performs first output switching control in which the output from the OUT terminal is switched from the L-signal to the H-signal. Accordingly, the voltage at the OUT terminal rises and reaches a threshold voltage, i.e., the midpoint potential Vt1 (V) between the partial pressure resistances R1 and R2, and the output voltage from the comparator CP1 becomes high. Simultaneously with this, the gate logic circuit GL performs charging control in which the MOS transistor P2 is turned on and the MOS transistor NB is turned off to charge the capacitor C1 connected to the CP terminal.

Upon receiving an input of an L-signal to the IN terminal, the gate logic circuit GL performs second output switching control in which the output from the OUT terminal is switched from the H-signal to the L-signal. Accordingly, the voltage at the OUT terminal drops and reaches the midpoint potential Vt1 (V), and the output voltage from the comparator CP1 becomes low. Simultaneously with this, the gate logic circuit GL performs negative-bias application control in which the MOS transistor P2 is turned off and the MOS transistor NB is turned on to apply a negative bias to the OUT terminal via the VEE terminal.

FIG. 4 is a control sequence diagram for the gate driver IC 201. As shown in FIG. 4, when an H-signal is input to the IN terminal in order to turn on the MOS transistor T1, the MOS transistor P1 (main source PMOS) is turned on and the MOS transistor N1 (main sink NMOS) is turned off so that the voltage at the OUT terminal rises toward the VCC voltage (high). At the same time as the comparator CP1 has detected the rise in the voltage at the OUT terminal to the midpoint potential Vt1 (V) between the partial pressure resistances R1 and R2, the MOS transistor P2 (charge PMOS) is turned on and the MOS transistor NB (negative-bias NMOS) is turned off. At this time, the voltage VC at the capacitor C1 connected to the CP terminal is charged up to VCC−VF (V).

On the other hand, when an L-signal is input to the IN terminal in order to turn off the MOS transistor T1, the MOS transistor P1 is turned off and the MOS transistor N1 is turned on the voltage at the OUT terminal drops. At the same time as the comparator CP1 has detected the drop in the voltage at the OUT terminal to the midpoint potential Vt1 (V), the MOS transistor P2 is turned off and the MOS transistor NB is turned on.

At this time, the voltage at the VEE terminal becomes −VC (−VCC+VF (V)) due to the discharge of the capacitor C1, and a negative bias is applied to the gate of the MOS transistor T1. The electric charge discharged from the capacitor C1 will be charged during the next period in which the voltage at the OUT terminal is High.

In this way, in the gate driving device 200, a negative bias is applied to the gate of the MOS transistor T1 when the MOS transistor T1 is turned off. At this time, the comparator CP1 monitors the voltage at the OUT terminal, and after the voltage at the OUT terminal has reached the midpoint potential Vt1 (V) between the partial pressure resistances, a negative bias is applied to the gate of the MOS transistor T1. This reduces the amount of consumption of the electric charge stored in the capacitor C1 and suppresses fluctuations in the negative bias level as compared to the case where a negative bias is applied in one stroke from the state in which the voltage at the OUT terminal is high.

The voltage at the OUT terminal is also monitored by the comparator CP1 when the MOS transistor T1 is turned on, and the capacitor C1 is charged after the voltage at the OUT terminal has reached the midpoint potential Vt1 (V) between the partial pressure resistances. This reduces the occurrence of a backflow of current to the gate of the MOS transistor T1 and prevents unstable operations of the MOS transistor T1 as compared to the case where the capacitor C1 is charged from the state in which the voltage at the OUT terminal is low.

Embodiment 3

FIG. 5 is a circuit diagram showing a configuration of a gate driving device 300 according to Embodiment 3 of the present disclosure. As shown in FIG. 5, the gate driving device 300 drives a high voltage-proof MOS transistor T1 of an N-type serving as a power device. The gate driving device 300 includes a gate driver IC 301, a diode D1, and a capacitor C1, the diode D1 and the capacitor C1 being provided outside the gate driver IC 301 to adjust the turn-off speed of the power device.

The gate driver IC 301 further includes partial pressure resistances R3 and R4 and a comparator CP2 in addition to the configuration of the gate driver IC 201 shown in FIG. 3. The partial pressure resistances R3 and R4 are connected in series between an internal terminal OP and a GND terminal. The comparator CP2 has a non-inverting input terminal (V+) connected to the CP terminal and an inverting input terminal (V−) connected to the midpoint between the partial pressure resistances R3 and R4 to receive input of a midpoint potential Vt2, and outputs an output voltage to the gate logic circuit GL. In FIG. 5, constituent elements that are identical to those of the gate driver IC 201 are given the same reference signs, and redundant descriptions thereof shall be omitted.

Upon receiving input of an H-signal to the IN terminal, the gate logic circuit GL performs first output switching control in which the output from the OUT terminal is switched from the L-signal to the H-signal. Accordingly, the voltage at the OUT terminal rises and reaches the midpoint potential Vt1 (V) between the partial pressure resistances R1 and R2, and the output voltage from the comparator CP1 becomes high. Simultaneously with this, the gate logic circuit GL performs charging control in which the MOS transistor P2 is turned on and the MOS transistor NB is turned off to charge the capacitor C1 connected to the CP terminal. However, the charging control is stopped at the same time as the capacitor C1 has been charged and the voltage at the CP terminal has risen and reached a threshold voltage, i.e., the midpoint potential Vt2 (V) between the partial pressure resistances R3 and R4.

FIG. 6 is a control sequence diagram for the gate driver IC 301. As shown in FIG. 6, when an H-signal is input to the IN terminal in order to turn on the MOS transistor T1, the MOS transistor P1 (main source PMOS) is turned on and the MOS transistor N1 (main sink NMOS) is turned off so that the voltage at the OUT terminal rises toward the VCC voltage (high). At the same time as the comparator CP1 has detected that the voltage at OUT terminal has risen to the midpoint potential Vt1 (V) between the partial pressure resistances R1 and R2, the MOS transistor P2 (charge PMOS) is turned on and the MOS transistor NB (negative-bias NMOS) is turned off. At this time, the capacitor C1 is charged until the comparator CP2 detects that the voltage VC of the capacitor C1 connected to the CP terminal has risen to the midpoint potential Vt2 (V) between the partial pressure resistances R3 and R4. When the comparator CP2 has detected that the voltage VC had reached the midpoint potential Vt2 (V), the comparator CP2 makes its output voltage low. When the output voltage of the comparator CP2 becomes low, the gate logic circuit GL stops the charging control for charging the capacitor C1 by making the gate voltage of the MOS transistor P2 high so as to turn off the MOS transistor P2. Accordingly, the voltage VC of the capacitor C1 connected to the CP terminal becomes Vt2−VF (V).

On the other hand, when an L-signal is input to the IN terminal in order to turn off the MOS transistor T1, the MOS transistor P1 is turned off and the MOS transistor N1 is turned on so that the voltage at the OUT terminal drops. At the same time as the comparator CP1 has detected that the voltage at the OUT terminal has reached the midpoint potential Vt1 (V), the MOS transistor NB is turned on. The MOS transistor P2 remains off while the CP terminal is charged to a desired voltage.

At this time, the voltage at the VEE terminal becomes −VC (−Vt2+VF (V)) due to the discharge of the capacitor C1, and a negative bias is applied to the gate of the MOS transistor T1. The electric charge discharged from the capacitor C1 will be charged during the next period in which the voltage at the OUT terminal is high.

In this way, in the gate driving device 300, a negative bias is applied to the gate of the MOS transistor T1 when the MOS transistor T1 is turned off. At this time, the comparator CP2 monitors the voltage VC of the capacitor C1 connected to the CP terminal, and the capacitor C1 is charged until the comparator CP2 detects that the voltage VC has reached the midpoint potential Vt2 (V) between the partial pressure resistances R3 and R4. When the output voltage of the comparator CP2 becomes low, the gate logic circuit GL stops the charging control for charging the capacitor C1 by turning off the MOS transistor P2. This enables adjusting the amount of electric charge stored in the capacitor C1 and setting the level of application of the negative bias to −VC (−Vt2+VF (V)). Accordingly, it is possible to more freely adjust the level of application of the negative bias than in the case where the voltage at the VEE terminal becomes −VC (−VCC+VF (V)) that is determined by the VCC voltage of the DC power supply PW.

Embodiment 4

Figure 7:
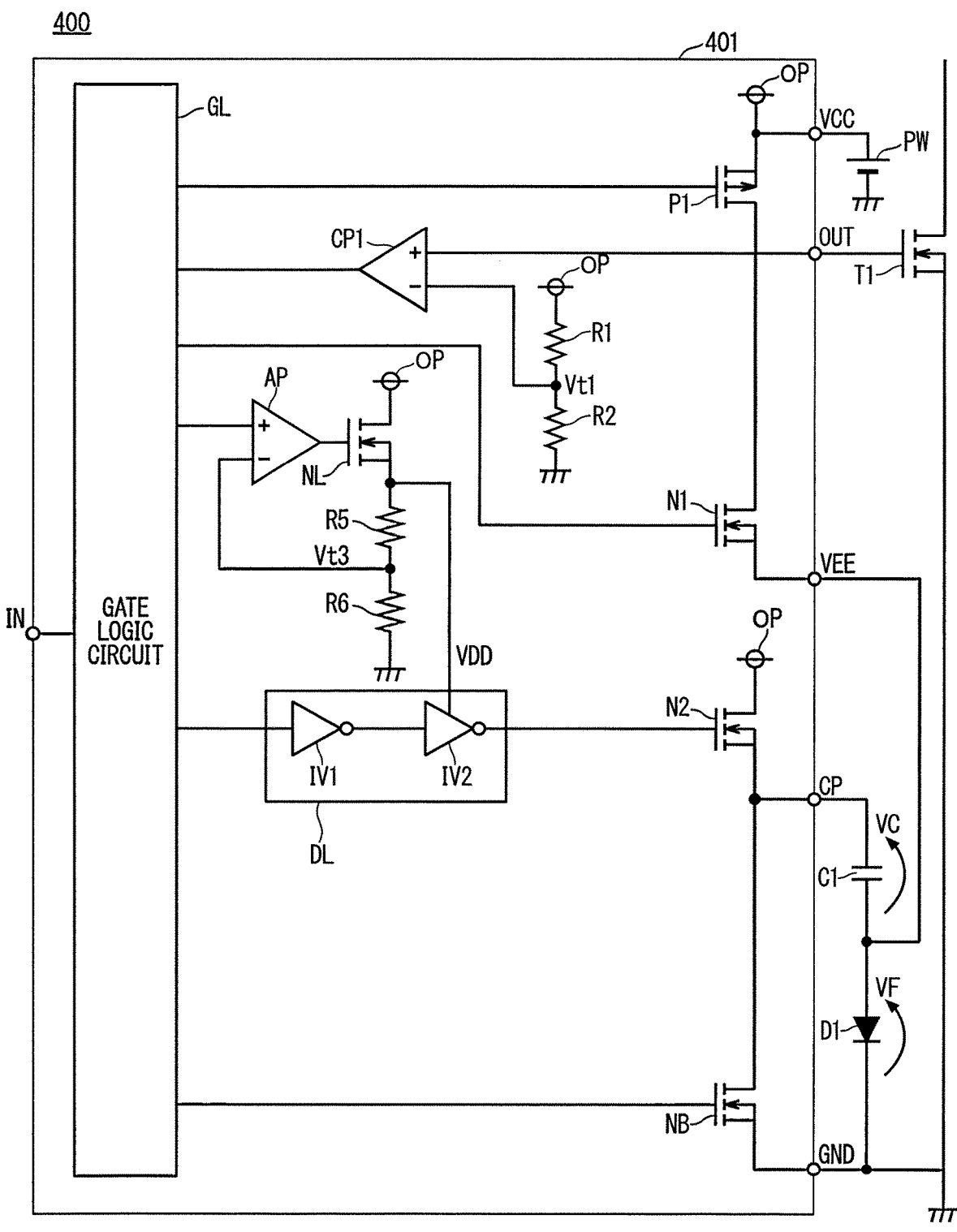
FIG. 7 is a circuit diagram showing a configuration of a gate driving device according to Embodiment 4 of the present disclosure.

FIG. 7 is a circuit diagram showing a configuration of a gate driving device 400 according to Embodiment 4 of the present disclosure. As shown in FIG. 7, the gate driving device 400 drives a high voltage-proof MOS transistor T1 of an N type serving as a power device. The gate driving device 400 includes a gate driver IC 401, a diode D1, and a capacitor C1, the diode D1 and the capacitor C1 being provided outside the gate driver IC 401 to adjust the turn-off speed of the power device.

The gate driver IC 401 further includes a negative level adjustment MOS transistor NL of the N type, partial pressure resistances R5 and R6, and an amplifier AP in addition to the configuration of the gate driver IC 201 shown in FIG. 3. The negative level adjustment MOS transistor NL is connected to the drain of an internal terminal OP. The partial pressure resistances R5 and R6 are connected in series between the source of the MOS transistor NL and a GND terminal. The amplifier AP has an non-inverting input terminal (V+) connected to the output of the gate logic circuit GL and an inverting input terminal (V−) connected to the midpoint between the partial pressure resistances R5 and R6, and inputs an output voltage to the gate of the MOS transistor NL.

Moreover, the P-type charge MOS transistor P2 (charge PMOS) in the gate driver IC 201 shown in FIG. 3 is replaced by an N-type charge MOS transistor N2 (charge NMOS). The gate driver IC 401 further includes a delay circuit DL that delays a signal of the gate logic circuit GL and outputs the delayed signal as a signal from the source potential (VDD) of the MOS transistor NL to the gate of the MOS transistor N2.

The delay circuit DL includes inverters IV1 and IV2 that are connected in series. The signal of the gate logic circuit GL is input to the inverter IV1, and the output of the inverter IV2 is output to the gate of the MOS transistor N2. The inverter IV2 includes an inverter circuit (not shown) that operates between a GND terminal and the source potential (VDD) of the MOS transistor NL. In FIG. 7, constituent elements that are identical to those of the gate driver IC 201 are given the same reference signs, and redundant descriptions thereof shall be omitted.

Upon receiving input of an H-signal to the IN terminal, the gate logic circuit GL performs first output switching control in which the output from the OUT terminal is switched from the L-signal to the H-signal. Accordingly, the voltage at the OUT terminal rises and reaches the midpoint potential Vt1 (V) between the partial pressure resistances R1 and R2, and the output voltage of the comparator CP1 becomes high. Simultaneously with this, the gate logic circuit GL performs charging control in which the MOS transistor N2 is turned on and the MOS transistor NB is turned off so as to charge the capacitor C1 connected to the CP terminal. However, the charging control is stopped at the same time as the capacitor C1 has been charged, the voltage at the CP terminal has risen, and the gate voltage of the MOS transistor N2 has reached VDD.

Figure 8:
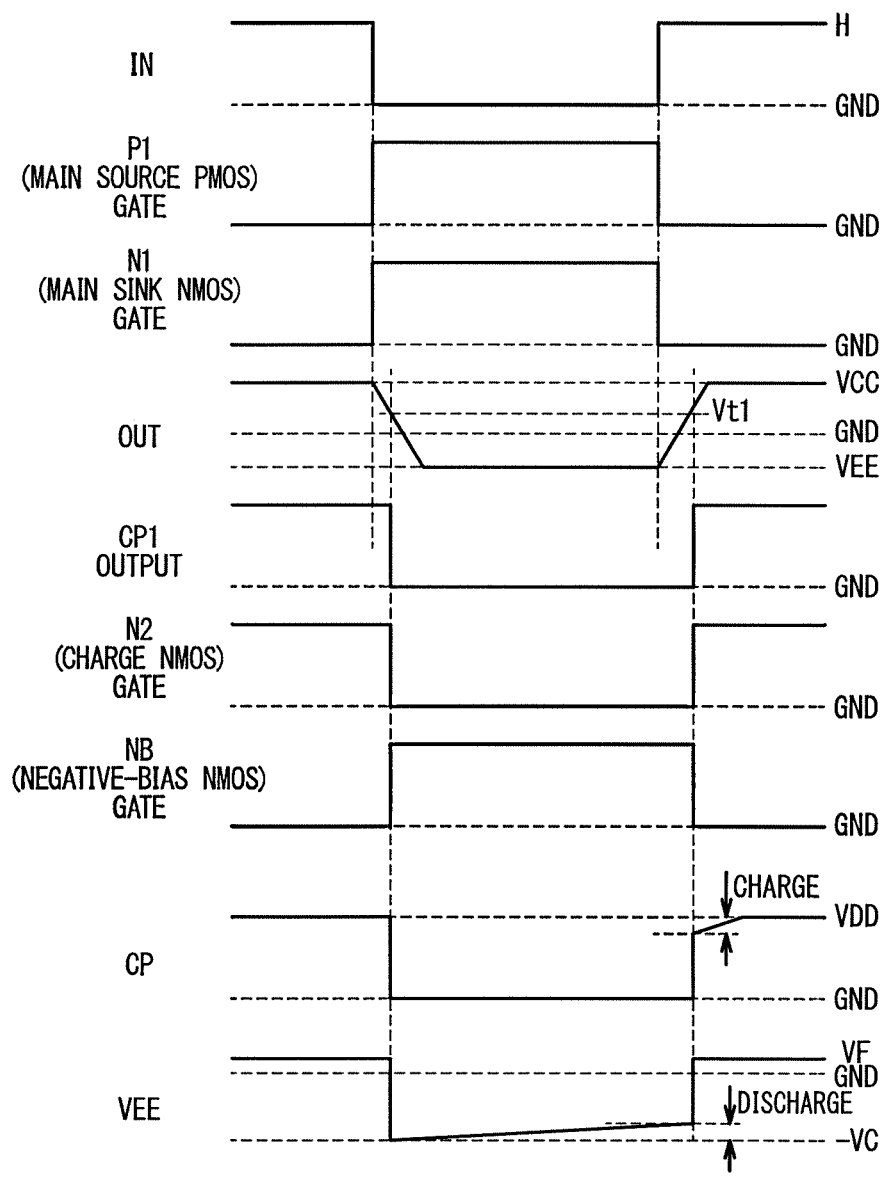
FIG. 8 is a control sequence diagram for the gate driving device according to Embodiment 4 of the present disclosure.

FIG. 8 is a control sequence diagram for the gate driver IC 401. As shown in FIG. 8, when an H-signal is input to the IN terminal in order to turn on the MOS transistor T1, the MOS transistor P1 (main source PMOS) is turned on and the MOS transistor N1 (main sink NMOS) is turned off so that the voltage at the OUT terminal rises toward the VCC voltage (high). At the same time as the comparator CP1 has detected that the voltage at the OUT terminal has risen and reached the midpoint potential Vt1 (V) between the partial pressure resistances R1 and R2, the MOS transistor N2 (charge NMOS) is turned on and the MOS transistor NB (negative-bias NMOS) is turned off. At this time, the capacitor C1 connected to the CP terminal is charged until the gate voltage of the MOS transistor N2 reaches VDD. At this time, the voltage VC of the capacitor C1 connected to the CP terminal is charged up to VDD–VF (V).

On the other hand, when an L-signal is input to the IN terminal in order to turn off the MOS transistor T1, the MOS transistor P1 is turned off and the MOS transistor N1 is turned on so that the voltage at the OUT terminal drops. At the same time as the comparator CP1 has detected that the voltage at the OUT terminal has reached the midpoint potential Vt1 (V) between the partial pressure resistances R1 and R2, the MOS transistor N2 is turned off and the MOS transistor NB is turned on.

At this time, the voltage at the VEE terminal becomes –VC (–VDD+VF (V)) due to the discharge of the capacitor C1, and a negative bias is applied to the gate of the MOS transistor T1. The electric charge discharged from the capacitor C1 is charged during the next period in which the voltage at the OUT terminal is high.

In this way, in the gate driving device 400, when the MOS transistor T1 is turned on, the capacitor C1 connected to the CP terminal is charged until the gate voltage of the MOS transistor N2 reaches VDD. Here, the voltage VDD is obtained from the product of the partial pressure resistances R5 and R6 and a current flowing through a constant-current circuit configured by the amplifier AP and the negative level adjustment MOS transistor NL of the N type. When the midpoint potential Vt3 (V) between the partial pressure resistances R5 and R6 is input to the inverting input terminal (V–) of the amplifier AP, the voltage VDD can be adjusted by a split resistance value obtained from the partial pressure resistances R5 and R6. Thus, when the voltage VDD lower than the VCC voltage is supplied as the gate voltage of the MOS transistor N2 for charging the capacitor C1, the capacitor C1 is charged only up to the gate voltage VDD and is prevented from being overcharged.

The gate driver IC 401 includes the delay circuit DL that delays the signal of the gate logic circuit GL. The delay circuit DL is a circuit that times the supply of the gate voltage of the MOS transistor N2 to the delay caused until the voltage VDD is obtained by the constant-current circuit configured by the amplifier AP and the MOS transistor NL.

Embodiment 5

FIG. 9 is a circuit diagram showing a configuration of a gate driving device 500 according to Embodiment 5 of the present disclosure. As shown in FIG. 9, the gate driving device 500 drives a high voltage-proof MOS transistor T1 of an n-channel type serving as a power device. The gate driving device 500 includes a gate driver IC 501 and a capacitor C1 that is provided outside the gate driver IC 501 to adjust the turn-off speed of the power device. The gate driver IC 501 further includes a driving MOS transistor DP of the P type (driving PMOS) and a diode alternate MOS transistor DN of the N type in addition to the configuration of the gate driver IC 401 shown in FIG. 7. The source of the MOS transistor DP is connected to an internal terminal OP, and the drain thereof is connected to the gate of the MOS transistor DN. The drain of the diode alternate MOS transistor DP is connected to a GND terminal, and the source thereof is connected to the VEE terminal. Note that a resistance R7 is connected between the drain of the MOS transistor DP and the source of the MOS transistor DN. In FIG. 9, constituent elements that are identical to those of the gate driver IC 401 are given the same reference signs, and redundant descriptions thereof shall be omitted.

Upon receiving input of an H-signal to the IN terminal, the gate logic circuit GL performs first output switching control in which the output from the OUT terminal is switched from the L-signal to the H-signal. Accordingly, the voltage at the OUT terminal rises and reaches the midpoint potential Vt1 (V) between the partial pressure resistances R1 and R2, and the output voltage of the comparator CP1 becomes high. Simultaneously with this, the gate logic circuit GL performs charging control in which the MOS transistor N2 is turned on and the MOS transistor NB is turned off to charge the capacitor C1 connected to the CP terminal. Simultaneously with this, the MOS transistor DP is turned on and the MOS transistor DN is turned on.

FIG. 10 is a control sequence diagram for the gate driver IC 501. As shown in FIG. 10, when an H-signal is input to the IN terminal in order to turn on the MOS transistor T1, the MOS transistor P1 (main source PMOS) is turned on and the MOS transistor N1 (main sink NMOS) is turned off so that the voltage at the OUT terminal rises toward the VCC voltage (high). At the same time as the comparator CP1 has detected that the voltage at the OUT terminal has risen and reached the midpoint potential Vt1 (V) between the partial pressure resistances R1 and R2, the MOS transistor N2 (charge NMOS) is turned on and the MOS transistor NB (negative-bias NMOS) is turned off. With this timing, the MOS transistor DP (driving PMOS) is turned on, so that the H-signal is input to the gate of the MOS transistor DN to turn on the MOS transistor DN. At this time, the capacitor C1 connected to the CP terminal is charged until the gate voltage of the MOS transistor N2 reaches VDD, so that the voltage VC of the capacitor C1 becomes VDD (V).

On the other hand, when an L-signal is input to the IN terminal in order to turn off the MOS transistor T1, the MOS transistor P1 is turned off and the MOS transistor N1 is turned on so that the voltage at the OUT terminal drops. At the same time as the comparator CP1 has detected that the voltage at the OUT terminal has reached the midpoint potential Vt1 (V) between the partial pressure resistances R1 and R2, the MOS transistor N2 is turned off and the MOS transistor NB is turned on. With this timing, the MOS transistor DP is turned off and the MOS transistor DN is also turned off.

At this time, the voltage at the VEE terminal becomes –VC (–VDD (V)) due to the discharge of the capacitor C1, and a negative bias is applied to the gate of the MOS transistor T1. The electric charge discharged from the capacitor C1 will be charged in the next period in which the voltage at the OUT terminal is high.

In this way, the gate driving device 500 includes only the capacitor C1 provided outside the gate driver IC 501 to adjust the turn-off speed of the power device, and does not include the diode D1, which is provided in the gate driving devices 100 to 400 according to Embodiments 1 to 4. Instead, the diode alternate MOS transistor DN is included in the gate driver IC 501.

Accordingly, although the forward voltage VF of the diode D1 is subtracted from the negative bias applied voltage in the gate driving devices 100 to 400, such a forward voltage VF is not subtracted in the gate driving device 500, and the voltage charged to the capacitor C1 can be applied as-is as the negative bias to the gate of the MOS transistor T1. This further speeds up the turn-off behavior of the MOS transistor T1. Besides, the inclusion of the diode function in the gate driver IC 501 reduces the size and cost of the gate driving device 500.

Embodiment 6

FIG. 11 is a circuit diagram showing a configuration of a gate driving device 600 according to Embodiment 6 of the present disclosure. As shown in FIG. 11, the gate driving device 600 drives a high voltage-proof MOS transistor T1 of an n-channel type serving as a power device. The gate driving device 600 includes a gate driver IC 601 and a capacitor C1 that is provided outside the gate driver IC 601 to adjust the turn-off speed of the power device.

The gate driver IC 601 further includes a boot charge MOS transistor RCN of the N type (boost charge NMOS) and a delay circuit DLI in addition to the configuration of the gate driver IC 501 shown in FIG. 9. The drain of the MOS transistor RCN is connected to an internal terminal OP, and the source thereof is connected to the CP terminal. The delay circuit DLI delays a signal of the gate logic circuit GL and outputs the delayed signal as a signal of the source potential (VDD) of a negative-level adjustment MOS transistor NL to the gate of the MOS transistor RCN.

The delay circuit DLI includes inverters IV3 and IV4 that are connected in series. The signal of the gate logic circuit GL is input to the inverter IV3, and the output of the inverter IV4 is output to the gate of the MOS transistor RCN. The inverter IV4 includes an inverter circuit (not shown) that operates between a GND terminal and the source potential (VDD) of the MOS transistor NL. In FIG. 11, constituent elements that are identical to those of the gate driver IC 501 are given the same reference signs, and redundant descriptions thereof shall be omitted.

FIG. 12 is a control sequence diagram for the gate driver IC 601. FIG. 12 shows a sequence from start-up of the DC power supply PW serving as the VCC power supply of the gate driver IC 601. At the start-up of the DC power supply PW, the MOS transistor RCN (boost charge NMOS) is turned on and the capacitor C1 is rapidly charged until the VCC voltage reaches a voltage Vpor. The voltage Vpor as used herein refers to a threshold voltage for a power-on reset circuit (not shown) that is included in the gate driver IC 601 to monitor the power supply voltage VCC.

Thereafter, when an H-signal is input to the IN terminal in order to turn on the MOS transistor T1, the MOS transistor P1 (main source PMOS) is turned on and the MOS transistor N1 (main sink NMOS) is turned off so that the voltage at the OUT terminal rises toward the VCC voltage (high). At the same time as the comparator CP1 has detected that the voltage at the OUT terminal has risen and reached the midpoint potential Vt1 (V) between the partial pressure resistances R1 and R2, the gate driver IC 601 performs charging control in which the MOS transistor N2 (charge NMOS) is turned on and the MOS transistor NB (negative-bias NMOS) is charged off to charge the capacitor C1 connected to the CP terminal. Simultaneously with this, the MOS transistor DP is turned on, and the MOS transistor DN is also turned on. At this time, the capacitor C1 connected to the CP terminal is charged until the gate voltage of the MOS transistor N2 reaches VDD, so that the voltage VC of the capacitor C1 becomes VDD (V).

On the other hand, when an L-signal is input to the IN terminal in order to turn off the MOS transistor T1, the MOS transistor P1 is turned off and the MOS transistor N1 is turned on so that the voltage at the OUT terminal drops. At the same time as the comparator CP1 has detected that the voltage at the OUT terminal has reached the midpoint potential Vt1 (V) between the partial pressure resistances R1 and R2, the MOS transistor N2 is turned off and the MOS transistor NB is turned on. With this timing, the MOS transistor DP is turned off, and the MOS transistor DN is also turned off.

At this time, the voltage at the VEE terminal becomes −VC (−VDD (V)) due to the discharge of the capacitor C1, and a negative bias is applied to the gate of the MOS transistor T1. The electric charge discharged from the capacitor C1 will be charged in the next period in which the voltage at the OUT terminal is high.

In this way, the gate driving device 600 additionally includes the MOS transistor RCN (boost charge NMOS) for initial charging of the capacitor C1, unlike the gate driving devices 100 to 500 according to Embodiments 1 to 5. Therefore, the switching of the MOS transistor T1 can be started in a state in which the capacitor C1 has been charged to a predetermined voltage, by quickly charging the capacitor C1 at the start-up of the DC power supply PW of the gate driver IC 601.

The gate driver IC 601 includes the delay circuit DLI that delays the signal of the gate logic circuit GL. The delay circuit DLI is a circuit that times the supply of the gate voltage of the MOS transistor RCN to the delay caused until the voltage VDD is obtained from the constant-current circuit configured by the amplifier AP and the MOS transistor NL.

Embodiment 7

Figure 13:
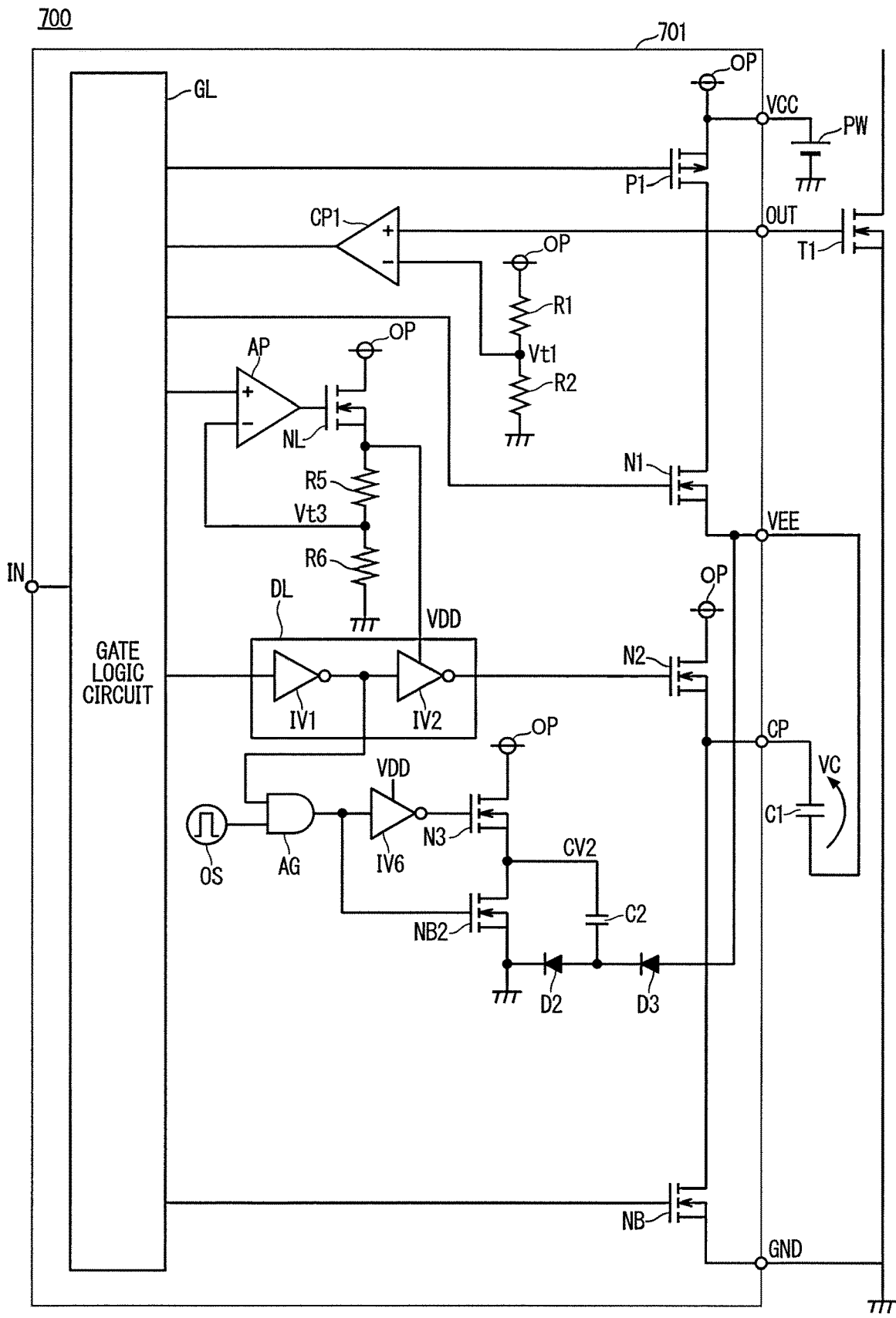
FIG. 13 is a circuit diagram showing a configuration of a gate driving device according to Embodiment 7 of the present disclosure.

FIG. 13 is a circuit diagram showing a configuration of a gate driving device 700 according to Embodiment 7 of the present disclosure. As shown in FIG. 13, the gate driving device 700 drives a high voltage-proof MOS transistor T1 of an N type serving as a power device. The gate driving device 700 includes a gate driver IC 701 and a capacitor C1 that is provided outside the gate driver IC 701 in order to adjust the turn-off speed of the power device.

The gate driver IC 701 further includes, in addition to the configuration of the gate driver IC 501 shown in FIG. 9, an N-type charge MOS transistor N3 (charge NMOS2) and a negative-bias MOS transistor NB2 (negative-bias NMOS2) that are connected in series between an internal terminal OP and a GND terminal. The drain of the MOS transistor N3 is connected to the internal terminal OP, and the source thereof is connected to the drain of the MOS transistor NB2. The source of the MOS transistor NB2 is connected to the GND terminal, and diodes D2 and D3 are connected in series between the source of the MOS transistor NB2 and the VEE terminal.

The cathode of the diode D2 is connected to the source of the MOS transistor NB2, and the anode of the diode D2 is connected to the cathode of the diode D3. The anode of the diode D3 is connected to the VEE terminal.

The gate driver IC 701 further includes a capacitor C2 that is connected between the source of the MOS transistor N3 and the anode of the diode D2.

The gate driver IC 701 further includes an inverter IV6 whose output is connected to the gate of the MOS transistor N3, an AND circuit AG whose output is connected to the input of the inverter IV6, and an oscillation circuit OS that is connected to one input of the AND circuit AG. The other input of the AND circuit AG is connected to the output of the inverter IV1, and the output of the AND circuit AG is connected to the input of the inverter IV6 and to the gate of the MOS transistor NB2. In FIG. 13, constituent elements that are identical to those of the gate driver IC 501 are given the same reference signs, and redundant descriptions thereof shall be omitted.

Upon receiving input of an H-signal to the IN terminal, the gate logic circuit GL performs first output switching control in which the output from the OUT terminal is switched from the L-signal to the H-signal. Accordingly, the voltage at the OUT terminal rises and reaches the midpoint potential Vt1 (V) between the partial pressure resistances R1 and R2, and the output voltage of the comparator CP1 becomes high. Simultaneously with this, the gate logic circuit GL performs charging control in which the MOS transistor N2 is turned on and the MOS transistor NB is turned off to charge the capacitor C1 connected to the CP terminal. Simultaneously with this, the MOS transistor N3 (charge NMOS2) is turned on and the MOS transistor NB2 (negative-bias NMOS2) is turned off so as to also charge the capacitor C2.

Upon receiving input of an L-signal to the IN terminal, the gate logic circuit GL performs second output switching control in which the output from the OUT terminal is switched from the H-signal to the L-signal. Accordingly, the voltage at the OUT terminal drops and reaches the midpoint potential Vt1 (V), and the output voltage of the comparator CP1 becomes low. Simultaneously with this, the gate logic circuit GL performs negative-bias application control in which the MOS transistor P2 is turned off and the MOS transistor NB is turned on to apply a negative bias to the OUT terminal via the VEE terminal. Simultaneously with this, the MOS transistor N3 (charge NMOS2) is turned off and the MOS transistor NB2 (negative-bias NMOS2) is repeatedly turned on and off in accordance with the frequency of the oscillation circuit OS. Accordingly, the capacitor C1 is charged with the electric charge charged to the capacitor C2, and thereby the discharge of the capacitor C1 is suppressed.

Figure 14:
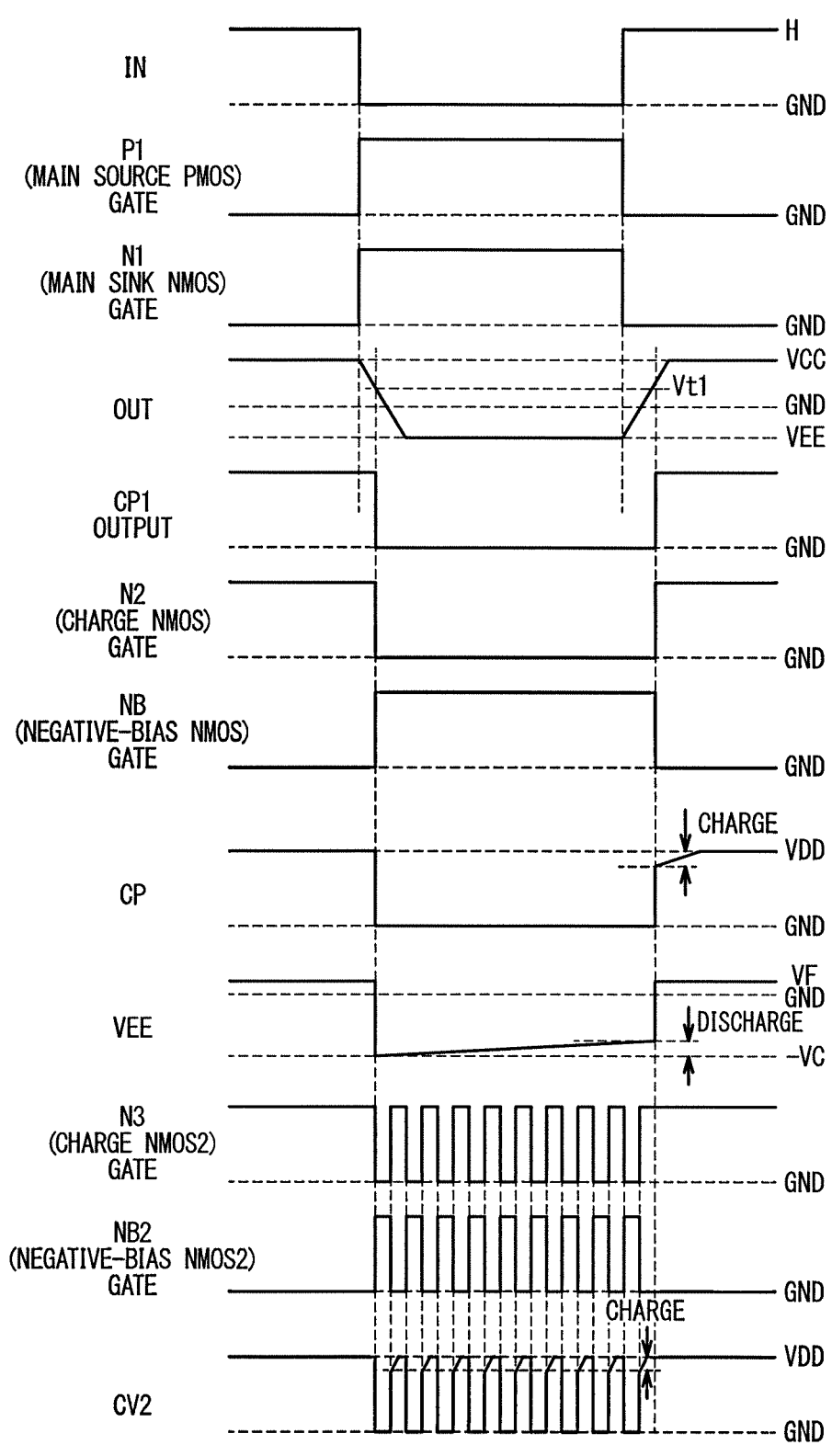
FIG. 14 is a control sequence diagram for the gate driving device according to Embodiment 7 of the present disclosure.

FIG. 14 is a control sequence diagram for the gate driver IC 701. As shown in FIG. 14, when an H-signal is input to the IN terminal in order to turn on the MOS transistor T1, the MOS transistor P1 (main source PMOS) is turned on and the MOS transistor N1 (main sink NMOS) is turned off so that the voltage at the OUT terminal rises toward the VCC voltage (high). At the same time as the comparator CP1 has detected that the voltage at the OUT terminal has risen and reached the midpoint potential Vt1 (V) between the partial pressure resistances R1 and R2, the MOS transistor N2 (charge NMOS) is turned on, the MOS transistor NB (negative-bias NMOS) is turned off, the MOS transistor N3 (charge NMOS2) is turned on, and the MOS transistor NB2 (negative-bias NMOS2) is turned off.

At this time, the capacitor C1 connected to the CP terminal is charged until the gate voltage of the MOS transistor N2 reaches VDD, so that the voltage VC of the capacitor C1 becomes VDD (V).

On the other hand, when an L-signal is input to the IN terminal in order to turn off the MOS transistor T1, the MOS transistor P1 is turned off and the MOS transistor N1 is turned on so that the voltage at the OUT terminal drops. At the same time as the comparator CP1 has detected that the voltage at the OUT terminal has reached the midpoint potential Vt1 (V) between the partial pressure resistances R1 and R2, the MOS transistor N2 is turned off, and the MOS transistor NB is turned on, the MOS transistor N3 is turned off, and the MOS transistor NB2 is repeatedly turned on and off in accordance with the frequency of the oscillation circuit OS.

At this time, the voltage at the VEE terminal becomes −VC (−VDD (V)) due to the discharge of the capacitor C1, and a negative bias is applied to the gate of the MOS transistor T1. Although the electric charge discharged from the capacitor C1 will be charged in the next period in which the voltage of the OUT terminal is high, the capacitor C1 is also charged with the electric charge stored in the capacitor C2 by repeatedly turning on and off the MOS transistor NB2 during the application of the negative bias, and thereby the discharge of the capacitor C1 is suppressed. This condition is indicated by the waveform of a voltage CV2 between the capacitor C2 and the source of the MOS transistor N3.

In the OFF state of the MOS transistor N2 that charges the capacitor C1, i.e., during the application of a negative bias, the electric charge stored in the capacitor C1 is gradually lost, and the negative bias level decreases. For example, even if the initial voltage at the VEE terminal is −10V, this voltage will change to −9V and to −8V. At this time, a negative voltage (−10V) is generated between the diodes D2 and D3 by turning on the MOS transistor N3 to charge the capacitor C2 and then turning on the MOS transistor NB2. Since the diode D3 becomes a forward bias due to a voltage of −8V at the anode and a voltage of −10V at the cathode, the capacitor C1 is charged with the electric charge stored in the capacitor C2 so as to bring the voltage at the VEE terminal closer to −10V from −8V. By repeating such operations during the application of a negative bias, it is possible to charge the capacitor C1 while discharging it by using the capacitor C2 and to suppress a decrease in the negative bias level of the VEE terminal.

In this way, in the gate driving device 700 that includes the capacitor C2, it is possible to charge the capacitor C1 with the electric charge stored in the capacitor C2 even during the application of a negative bias while suppressing the discharge of the capacitor C1, and thereby to suppress fluctuations in the negative bias voltage.

Variation 1

While the gate driver IC 701 according to Embodiment 7 described above is configured by adding the MOS transistor N3 (charge NMOS2) and the MOS transistor NB2 (negative-bias NMOS2) to the configuration of the gate driver IC 501 according to Embodiment 5 shown in FIG. 9, the MOS transistor N3 and the MOS transistor NB2 may also be added to the configurations of the gate driver ICs 101 to 103 according to Embodiments 1 to 3.

Example of Addition to Embodiment 1

Figure 15:
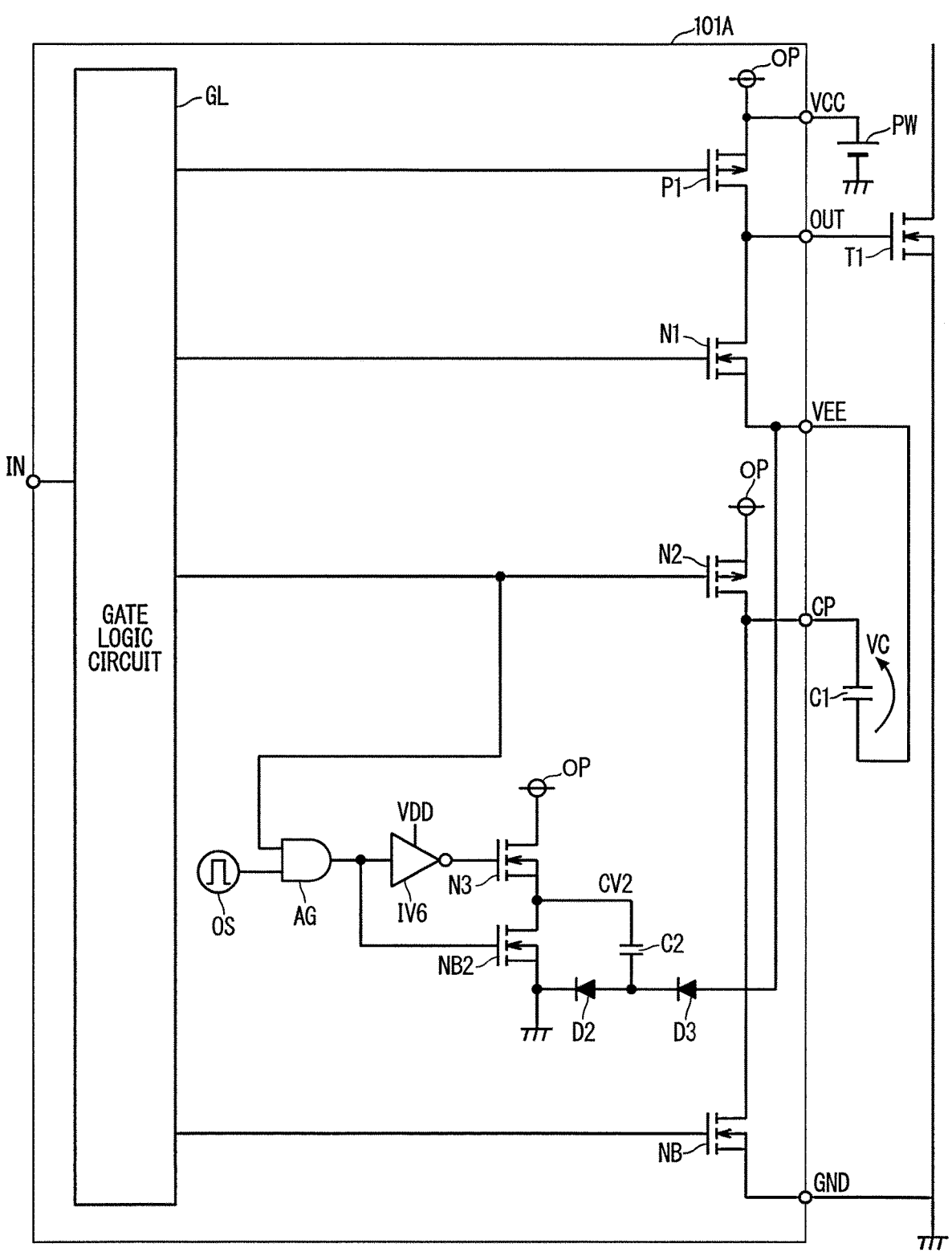
FIG. 15 is a circuit diagram showing a configuration according to Variation 1 of Embodiment 7 of the present disclosure.

FIG. 15 is a circuit diagram showing a configuration of a gate driver IC 101A configured by adding the MOS transistor N3 (charge NMOS2) and the MOS transistor NB2 (negative-bias NMOS2) to the gate driver IC 101 according to Embodiment 1. In FIG. 15, constituent elements that are identical to those of the gate driver IC 101 shown in FIG. 1 are given the same reference signs, and redundant descriptions thereof shall be omitted.

In the gate driver IC 101A shown in FIG. 15, a logic signal from the gate logic circuit GL is input to the gate of the MOS transistor P2 (charge PMOS) and to the AND circuit AG. The other configuration is the same as the configuration of the circuit for changing the capacitor C1, configured by the capacitor C2 connected to the MOS transistor N3 and the MOS transistor NB2 of the gate driver IC 701 according to the Embodiment 7 shown in FIG. 13. The gate driver IC 101A does not include an outboard diode D1.

Example of Addition to Embodiment 2

FIG. 16 is a circuit diagram showing a configuration of a gate driver IC 201A configured by adding the MOS transistor N3 (charge NMOS2) and the MOS transistor NB2 (negative-bias NMOS2) to the gate driver IC 201 according to Embodiment 2. In FIG. 16, constituent elements that are identical to those of the gate driver IC 201 shown in FIG. 3 are given the same reference signs, and redundant descriptions thereof shall be omitted.

In the gate driver IC 201A shown in FIG. 16, a logic signal from the gate logic circuit GL is input to the gate of the MOS transistor P2 (charge PMOS) and to the AND circuit AG. The other configuration is the same as the circuit for charging the capacitor C1, configured by the capacitor C2 connected to the MOS transistor N3 and the MOS transistor NB2 of the gate driver IC 701 according to Embodiment 7 shown in FIG. 13. The gate driver IC 201A does not include an outboard diode D1.

Example of Addition to Embodiment 3

FIG. 17 is a circuit diagram showing a configuration of a gate driver IC 301A obtained by adding the MOS transistor N3 (charge NMOS2) and the MOS transistor NB2 (negative-bias NMOS2) to the gate driver IC 301 according to Embodiment 3. In FIG. 17, constituent elements that are identical to those of the gate driver IC 301 shown in FIG. 5 are given the same reference signs, and redundant descriptions thereof shall be omitted.

In the gate driver IC 301A shown in FIG. 17, a logic signal from the gate logic circuit GL is input to the gate of the MOS transistor P2 (charge PMOS) and to the AND circuit AG. The other configuration is the same as the configuration of the circuit for charging the capacitor C1, configured by the capacitor C2 connected to the MOS transistor N3 and the MOS transistor NB2 of the gate driver IC 701 according to Embodiment 7 shown in FIG. 13. The gate driver IC 301A does not include an outboard diode D1.

Variation 2

While the gate driver IC 701 according to Embodiment 7 shown in FIG. 13 includes the diodes D2 and D3 that are connected in series between the source and the VEE terminal to adjust the turn-off speed of the power device, the diodes D2 and D3 may be replaced by an N-type diode alternate MOS transistor of the gate driver IC 501 according to Embodiment 5.

FIG. 18 is a circuit diagram showing a configuration of a gate driver IC 701A configured by replacing the diodes D2 and D3 of the gate driver IC 701 according to Embodiment 7 by an N-type diode alternate MOS transistor. In FIG. 18, constituent elements that are identical to those of the gate driver IC 701 shown in FIG. 13 are given the same reference signs, and redundant descriptions thereof shall be omitted.

As shown in FIG. 18, the gate driver IC 701A includes an N-type diode alternate MOS transistor DN2 (diode alternate NMOS2) and a diode alternate MOS transistor DN3 (diode alternate NMOS 3) that are connected in series between the VEE terminal and the source of the MOS transistor NB2. The source of the MOS transistor DN2 is connected to a GND terminal, and the drain thereof is connected to the source of the MOS transistor DN3. The drain of the MOS transistor DN3 is connected to the VEE terminal. The capacitor C2 is connected between the MOS transistor DN2 and the MOS transistor DN3.

The output of the AND circuit AG is connected to the input of the inverter IV6 and to the gate of the MOS transistor NB2 and a level shifting circuit LS. The level shifting circuit LS is a circuit that changes the potential of a signal from the GND reference to the VEE reference. The output of the level shifting circuit LS is connected to the inverter IV7, and the output of the inverter IV7 is connected to the inverter IV8. The inverters IV7 and IV8 operate between the VCC voltage and the VEE voltage. The output of the inverter IV7 is input to the gate of the MOS transistor DN2, and the output of the inverter IV8 is input to the gate of the MOS transistor DN3.

FIG. 19 is a control sequence diagram for the gate driver IC 701A. As shown in FIG. 19, the control sequence diagram for the gate driver IC 701A is basically the same as the control sequence diagram for the gate driver IC 701 shown in FIG. 14, but differs in that gate signals of the MOS transistors DN2 and DN3 are synchronized with the charging/discharging cycle of the capacitor C2 by repeatedly turning on and off these transistors in accordance with the frequency of the oscillation circuit OS.

In this way, since the gate driver IC 701A includes the MOS transistor DN2 (diode alternate NMOS2) and the MOS transistor DN3 (diode alternate NMOS 3), a negative bias applied voltage charged to the capacitor C1 is applied to the gate of the MOS transistor T1. This further speeds up the turn-off behavior of the MOS transistor T1. Besides, the inclusion of the diode function in the gate driver IC 701A reduces the size and cost of the gate driving device 500.

The present disclosure described above are summarized in Appendixes as follows.

Appendix 1

A gate driving device for driving a gate of a transistor comprises a gate driver circuit, a first capacitor provided outside, and a first diode. The gate driver circuit includes a first transistor of a first conductivity type, a second transistor of a second conductivity type, a first charge transistor, a first negative-bias transistor, and a logic circuit. The first transistor and the second transistor operate complementarily, are connected in series between a first node and a second node, and have a connection node serving as an output node of the gate driving device, the first node being a node to which a first voltage is applied, the second node being a node to which a second voltage lower than the first voltage is applied. The first charge transistor and the first negative-bias transistor are connected in series between the first node and a third node and have a connection node connected to a capacitance node, the third node being a node to which a third voltage lower than the first voltage and higher than the second voltage is applied, the capacitance node being connected to one electrode of the first capacitor. The logic circuit controls the first transistor, the second transistor, the first charge transistor, and the first negative-bias transistor. The first diode has an anode connected to the second node and to the other electrode of the first capacitor and has a cathode connected to the third node.

Appendix 2

A gate driving device for driving a gate of a transistor comprises a gate driver circuit and a first capacitor provided outside. The gate driver circuit includes a first transistor of a first conductivity type, a second transistor of a second conductivity type, a first charge transistor, a first negative-bias transistor, a diode alternate transistor, a drive transistor, and a logic circuit. The first transistor and the second transistor operate complementarily, are connected in series between a first node and a second node, and have a connection node serving as an output node of the gate driving device, the first node being a node to which a first voltage is applied, the second node being a node to which a second voltage lower than the first voltage is applied. The first charge transistor and the first negative-bias transistor are connected in series between the first node and a third node and have a connection node connected to a capacitance node, the third node being a node to which a third voltage lower than the first voltage and higher than the second voltage is applied, the capacitance node being connected to one electrode of the first capacitor. The diode alternate transistor is connected between the second node and the third node. The drive transistor drives a gate of the diode alternate transistor. The logic circuit controls the first transistor, the second transistor, the first charge transistor, the first negative-bias transistor, and the drive transistor.

Appendix 3

In the gate driving device described in Appendix 1 or 2, the gate driver circuit monitors the output node, and the logic circuit performs charging control when a voltage at the output node has risen from the second voltage and reached a threshold voltage, and performs negative-bias application control when the voltage at the output node has dropped from the first voltage and reached the threshold voltage. The charging control is such that the first charge transistor is turned on and the first negative-bias transistor is turned off to charge the first capacitor. The negative-bias application control is such that the first charge transistor is turned off and the first negative-bias transistor is turned on to apply a negative bias to the first transistor.

Appendix 4

In the gate driving device described in Appendix 3, the gate driver circuit monitors a voltage at the capacitance node, and the logic circuit turns off the first charge transistor to end the charging control when the voltage at the capacitance node has reached a threshold voltage.

Appendix 5

In the gate driving device described in Appendix 3, the first conductivity type is a P type, the second conductivity type is an N type, the first charge transistor is a first MOS transistor of the N type, and the gate driver circuit generates a gate voltage lower than the first voltage and supplies the gate voltage to a gate of the first MOS transistor.

Appendix 6

In the gate driving device described in Appendix 5, the gate driver circuit further include a second charge transistor connected between the first node and the capacitance node, the second charge transistor is a second MOS transistor of the N type, and at boot-up of a power supply that supplies the first voltage, the logic circuit controls the second MOS transistor to maintain the second MOS transistor in an ON state until the first voltage reaches a threshold voltage from the third voltage and to turn off the second MOS transistor when the first voltage has reached the threshold voltage.

Appendix 7

In the gate driving device described in Appendix 2, the gate driver circuit further includes a third charge transistor, a second negative-bias transistor, a second diode, a third diode, and a second capacitor. The third charge transistor and the second negative-bias transistor are connected in series between the first node and the third node. The second diode and the third diode are connected in series between the third node and the second node. The second capacitor is connected between a connection node of the third charge transistor and the second negative-bias transistor and a connection node of the second diode and the third diode. The gate driver circuit monitors a voltage of the output node. When the voltage at the output node has risen from the second voltage and reached a threshold voltage, the logic circuit performs charging control in which the first charge transistor is turned on and the first negative-bias transistor is turned off to charge the first capacitor. When the voltage at the output node has dropped from the first voltage and reached the threshold voltage, the logic circuit performs negative-bias application control in which the first charge transistor is turned off and the first negative-bias transistor is turned on to apply a negative bias to the first transistor, and simultaneously performs control for turning off the third charge transistor and repeatedly turning on and off the second negative-bias transistor to repeat charging and discharging of the second capacitor

Appendix 8

In the gate driving device described in Appendix 7, the gate driver circuit includes an oscillation circuit and repeatedly gives an ON signal and an OFF signal to a gate of the second negative-bias transistor in accordance with a frequency of the oscillation circuit While the invention has been shown and described in detail, the foregoing description is in all aspects illustrative and not restrictive. It is therefore understood that numerous modifications and variations can be devised without departing from the scope of the invention.

What is claimed is:

1. A gate driving device for driving a gate of a transistor, the gate driving device comprising:
    a gate driver circuit that includes a first transistor of a first conductivity type, a second transistor of a second conductivity type, a first charge transistor, a first negative-bias transistor, and a logic circuit;
    a first capacitor provided outside; and
    a first diode,
    wherein the first transistor and the second transistor operate complementarily, are connected in series between a first node and a second node, and have a connection node serving as an output node of the gate driving device, the first node being a node to which a first voltage is applied, the second node being a node to which a second voltage lower than the first voltage is applied,
    the first charge transistor and the first negative-bias transistor are connected in series between the first node and a third node and have a connection node connected to a capacitance node, the third node being a node to which a third voltage lower than the first voltage and higher than the second voltage is applied, the capacitance node being connected to one electrode of the first capacitor,
    the logic circuit controls the first transistor, the second transistor, the first charge transistor, and the first negative-bias transistor, and
    the first diode has an anode connected to the second node and to the other electrode of the first capacitor and has a cathode connected to the third node.
2. The gate driving device according to claim 1, wherein the gate driver circuit monitors a voltage at the output node,
    when the voltage at the output node has risen from the second voltage and reached a threshold voltage, the logic circuit performs charging control in which the first charge transistor is turned on and the first negative-bias transistor is turned off to charge the first capacitor, and when the voltage at the output node has dropped from the first voltage and reached the threshold voltage, the logic circuit performs negative-bias application control in which the first charge transistor is turned off and the first negative-bias transistor is turned on to apply a negative bias to the first transistor.

3. The gate driving device according to claim 2, wherein the gate driver circuit monitors a voltage at the capacitance node, and when the voltage at the capacitance node has reached a threshold voltage, the logic circuit turns off the first charge transistor to end the charging control.

4. The gate driving device according to claim 2, wherein the first conductivity type is a P type, the second conductivity type is an N type, the first charge transistor is a first MOS transistor of the N type, and the gate driver circuit generates a gate voltage lower than the first voltage and supplies the gate voltage to a gate of the first MOS transistor.

5. The gate driving device according to claim 4, wherein the gate driver circuit further includes a second charge transistor connected between the first node and the capacitance node, the second charge transistor is a second MOS transistor of the N type, and at boot-up of a power supply that supplies the first voltage, the logic circuit controls the second MOS transistor to maintain the second MOS transistor in an ON state until the first voltage reaches a threshold voltage from the third voltage and to turn off the second MOS transistor when the voltage has reached the threshold voltage.

6. A gate driving device for driving a gate of a transistor, the gate driving device comprising:

a gate driver circuit that includes a first transistor of a first conductivity type, a second transistor of a second conductivity type, a first charge transistor, a first negative-bias transistor, a diode alternate transistor, a drive transistor, and a logic circuit; and a first capacitor provided outside, wherein the first transistor and the second transistor operate complementarily, are connected in series between a first node and a second node, and have a connection node serving as an output node of the gate driving device, the first node being a node to which a first voltage is applied, the second node being a node to which a second voltage lower than the first voltage is applied, the first charge transistor and the first negative-bias transistor are connected in series between the first node and a third node and have a connection node connected to a capacitance node, the third node being a node to which a third voltage lower than the first voltage and higher than the second voltage is applied, the capacitance node being connected to one electrode of the first capacitor, the diode alternate transistor is connected between the second node and the third node, the drive transistor drives a gate of the diode alternate transistor, and the logic circuit controls the first transistor, the second transistor, the first charge transistor, the first negative-bias transistor, and the drive transistor.

7. The gate driving device according to claim 6, wherein the gate driver circuit monitors a voltage at the output node, when the voltage at the output node has risen from the second voltage and reached a threshold voltage, the logic circuit performs charging control in which the first charge transistor is turned on and the first negative-bias transistor is turned off to charge the first capacitor, and when the voltage at the output node has dropped from the first voltage and reached the threshold voltage, the logic circuit performs negative-bias application control in which the first charge transistor is turned off and the first negative-bias transistor is turned on to apply a negative bias to the first transistor.

8. The gate driving device according to claim 7, wherein the gate driver circuit monitors a voltage at the capacitance node, and when the voltage at the capacitance node has reached a threshold voltage, the logic circuit turns off the first charge transistor to end the charging control.

9. The gate driving device according to claim 7, wherein the first conductivity type is a P type, the second conductivity type is an N type, the first charge transistor is a first MOS transistor of the N type, and the gate driver circuit generates a gate voltage lower than the first voltage and supplies the gate voltage to a gate of the first MOS transistor.

10. The gate driving device according to claim 9, wherein the gate driver circuit further includes a second charge transistor connected between the first node and the capacitance node, the second charge transistor is a second MOS transistor of the N type, and at boot-up of a power supply that supplies the first voltage, the logic circuit controls the second MOS transistor to maintain the second MOS transistor in an ON-state until the first voltage reaches a threshold voltage from the third voltage and to turn off the second MOS transistor when the first voltage has reached the threshold voltage.

11. The gate driving device according to claim 6, wherein the gate driver circuit further includes:

a third charge transistor;

a second negative-bias transistor;

a second diode;

a third diode; and a second capacitor, the third charge transistor and the second negative-bias transistor being connected in series between the first node and the third node, the second diode and the third diode being connected in series between the third node and the second node, the second capacitor being connected between a connection node of the third charge transistor and the second negative-bias transistor and a connection node of the second diode and the third diode, the gate driver circuit monitors a voltage at the output node, when the voltage at the output node has risen from the second voltage and reached a threshold voltage, the logic circuit performs charging control in which the first charge transistor is turned on and the first negative-bias transistor is turned off to charge the first capacitor, and when the voltage at the output node has dropped from the first voltage and reached the threshold voltage, the logic circuit performs negative-bias application control in which the first charge transistor is turned off and the first negative-bias transistor is turned on to apply a negative bias to the first transistor, and simultaneously performs control for turning off the third charge transistor and repeatedly turning on and off the second negative-bias transistor to repeat charging and discharging of the second capacitor.

12. The gate driving device according to claim 11, wherein the gate driver circuit includes an oscillation circuit, and an ON signal and an OFF signal are repeatedly given to a gate of the second negative-bias transistor in accordance with a frequency of the oscillation circuit.

* * * * *